(12) United States Patent
Song et al.

(10) Patent No.: US 12,387,811 B2
(45) Date of Patent: Aug. 12, 2025

(54) SEMICONDUCTOR MEMORY DEVICE INCLUDING AN ON-DIE ECC ENGINE

(71) Applicant: Samsung Electronics Co., Ltd., Suwon-si (KR)

(72) Inventors: Yujung Song, Suwon-si (KR); Sungrae Kim, Suwon-si (KR); Gilyoung Kang, Suwon-si (KR); Hyeran Kim, Suwon-si (KR); Chisung Oh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 156 days.

(21) Appl. No.: 18/174,186

(22) Filed: Feb. 24, 2023

(65) Prior Publication Data

US 2024/0029808 A1    Jan. 25, 2024

(30) Foreign Application Priority Data

Jul. 20, 2022   (KR) .................. 10-2022-0089304
Oct. 7, 2022    (KR) .................. 10-2022-0128271

(51) Int. Cl.
  *G11C 29/00*    (2006.01)
  *G11C 29/12*    (2006.01)
  *G11C 29/42*    (2006.01)
  *G11C 29/46*    (2006.01)

(52) U.S. Cl.
  CPC .......... *G11C 29/42* (2013.01); *G11C 29/1201* (2013.01); *G11C 29/46* (2013.01)

(58) Field of Classification Search
  CPC ..... G11C 29/42; G11C 29/1201; G11C 29/46; G11C 29/02; G11C 29/022; G11C 2029/0411; G11C 29/52

See application file for complete search history.

(56) References Cited

U.S. PATENT DOCUMENTS

| | | | |
|---|---|---|---|
| 5,056,089 A | * | 10/1991 | Furuta ................ G06F 11/1008 |
| | | | 714/E11.036 |
| 6,182,248 B1 | | 1/2001 | Armstrong et al. |
| 6,751,756 B1 | | 6/2004 | Hartnett et al. |
| 7,308,639 B2 | | 12/2007 | Park et al. |
| 7,373,583 B2 | | 5/2008 | Hummler |
| 9,246,519 B2 | | 1/2016 | Singleton et al. |
| 10,043,588 B2 | | 8/2018 | Byeon |
| 10,061,645 B2 | | 8/2018 | Suh et al. |

(Continued)

FOREIGN PATENT DOCUMENTS

| KR | 20170070933 A | 6/2017 |
|---|---|---|
| KR | 2350644 | 8/2019 |

*Primary Examiner* — Mushfique Siddique
(74) *Attorney, Agent, or Firm* — Myers Bigel, P.A.

(57) ABSTRACT

A semiconductor memory device includes a memory cell array, an on-die error correction code (ECC) engine and a control logic circuit. The on-die ECC engine includes a first latch and a second latch. The control logic circuit sets the semiconductor memory device to a test mode in response to a first mode register set command. The on-die ECC engine, in the test mode, cuts off a connection with the memory cell array, receives a test data, stores the test data in the first latch, performs an ECC decoding on the test data stored in the first latch and a test parity data, stored in the second latch in response to a read command and provides an external device with a severity signal indicating whether the test data and the test parity data includes at least one error bit and the at least one error bit is correctable.

18 Claims, 21 Drawing Sheets

(56) References Cited

U.S. PATENT DOCUMENTS

| | | | |
|---|---|---|---|
| 10,248,521 B2 | 4/2019 | Catherwood et al. | |
| 10,748,638 B2 | 8/2020 | Cho | |
| 10,818,375 B2* | 10/2020 | Son | G11C 29/02 |
| 11,309,050 B2 | 4/2022 | Cho | |
| 2016/0378597 A1* | 12/2016 | Chung | G11C 29/52 |
| | | | 714/764 |
| 2019/0027230 A1* | 1/2019 | Ryu | G06F 11/1048 |
| 2019/0146870 A1* | 5/2019 | Cha | H03M 13/2906 |
| | | | 714/755 |
| 2020/0192754 A1* | 6/2020 | Cho | G06F 11/1048 |
| 2021/0224155 A1* | 7/2021 | Bains | G06F 11/1048 |
| 2021/0343325 A1* | 11/2021 | Moon | G11C 11/4076 |
| 2022/0122685 A1 | 4/2022 | Ahn et al. | |
| 2024/0146335 A1* | 5/2024 | Kim | G06F 11/10 |

* cited by examiner

FIG. 5

|          | DQ1 | DQ2 | DQ3 | ... | DQk |
|----------|-----|-----|-----|-----|-----|
| EB_BL_SG1 | V | V | V | ... | V |
| EB_BL_SG2 | V | V | V | ... | V |
| EB_BL_SG3 | V | V | V | ... | V |
| ⋮ | ⋮ | ⋮ | ⋮ | ⋮ | ⋮ |
| EB_BL_SGk | V | V | V | V | V |

V=L : NO ERROR INJECTION
V=H : ERROR INJECTION

FIG. 6

|          | DQ1 | DQ2 | DQ3 | ... | DQk |
|----------|-----|-----|-----|-----|-----|
| EB_BL_SG1 | H | L | L | ... | L |
| EB_BL_SG2 | L | L | L | ... | L |
| EB_BL_SG3 | L | L | L | ... | L |
| ⋮ | ⋮ | ⋮ | ⋮ | ⋮ | ⋮ |
| EB_BL_SGk | L | L | L |  | L |

FIG. 7

|           | DQ1 | DQ2 | DQ3 | ... | DQk |
|-----------|-----|-----|-----|-----|-----|
| EB_BL_SG1 | L   | L   | L   | ... | L   |
| EB_BL_SG2 | H   | L   | L   | ... | L   |
| EB_BL_SG3 | H   | L   | L   | ... | L   |
| ⋮         | ⋮   | ⋮   | ⋮   | ⋮   | ⋮   |
| EB_BL_SGk | L   | L   | L   | ... | L   |

FIG. 10

MRx

| OP[6:0] | Function | Description |
|---|---|---|
| OP[6] | ECC_Error_Injection | 0:Normal Operation(default)<br>1:ECC Error Injection Mode |
| OP[5] | Error_Pattern | 0:CW0(all 0s)<br>1:CW1(all 1s) |
| OP[4] | Parity_Error | 0:No Parity Error(default)<br>1:Parity Error |
| OP[3:0] | Parity_sel | Select one parity bit for error injection<br>Parity_sel 4b→error_mask 16b<br>[0000] → [1000000000000000]<br>⋮<br>[1111] → [0000000000000001] |

FIG. 17

| Expected SEV | Error Pattern Input | Error Pattern Output | Parity Error | SEV Result |
|---|---|---|---|---|
| NE | 000 ⋯ 000000 | 000 ⋯ 000000 | 000 ⋯ 000000 | NE |
| CE | 100 ⋯ 000000 | 000 ⋯ 000000 | 000 ⋯ 000000 | CE |
| CE | 000 ⋯ 000000 | 000 ⋯ 000000 | 100 ⋯ 000000 | CE |
| UE | 100 ⋯ 000000 | 100 ⋯ 000000 | 100 ⋯ 000000 | UE |
| UE | 110 ⋯ 000000 | 110 ⋯ 000000 | 000 ⋯ 000000 | UE |

FIG. 18

| Expected SEV | Error Pattern Input | Error Pattern Output | Parity Error | SEV Result |
|---|---|---|---|---|
| NE | 111 ... 111111 | 111 ... 111111 | 000 ... 000000 | NE |
| CE | 011 ... 111111 | 111 ... 111111 | 000 ... 000000 | CE |
| | 111 ... 111111 | 111 ... 111111 | 100 ... 000000 | |
| UE | 011 ... 111111 | 011 ... 111111 | 100 ... 000000 | UE |
| | 001 ... 111111 | 001 ... 111111 | 000 ... 000000 | |

SEMICONDUCTOR MEMORY DEVICE INCLUDING AN ON-DIE ECC ENGINE

CROSS-REFERENCE TO RELATED APPLICATIONS

This application claims priority under 35 U.S.C. § 119 to Korean Patent Application No. 10-2022-0089304, filed on Jul. 20, 2022 and to Korean Patent Application No. 10-2022-0128271, filed on Oct. 7, 2022 in the Korean Intellectual Property Office, the disclosure of which are incorporated by references herein in their entirety.

BACKGROUND

The present disclosure relates to memories, and more particularly to semiconductor memory devices and memory systems including the same.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrink in fabrication design rules of DRAMs, bit errors of memory cells in the DRAMs may rapidly increase and yield of the DRAMs may decrease. Therefore, there is a need for reliability of the semiconductor memory device.

SUMMARY

Some example embodiments provide a semiconductor memory device capable of enhancing test coverage.

Some example embodiments provide a memory system capable of enhancing test coverage.

According to example embodiments, a semiconductor memory device includes a memory cell array, an on-die error correction code (ECC) engine and a control logic circuit. The memory cell array includes a plurality of memory cells coupled to a plurality of word-lines and a plurality of bit-lines. The on-die ECC engine includes a first latch and a second latch. The control logic circuit controls the on-die ECC engine. The control logic circuit sets the semiconductor memory device to a test mode in response to a first mode register set command from an external device. The on-die ECC engine, in the test mode, cuts off an electrical connection with the memory cell array, receives a test data accompanied by a write command from the external device, stores the test data in the first latch, performs an ECC decoding on the test data stored in the first latch and a test parity data selectively including a specific error bit, stored in the second latch in response to a read command from the external device and provides the external device with a severity signal indicating whether the test data and the test parity data includes at least one error bit and indicating whether the at least one error bit is correctable, based on a result of the ECC decoding.

According to example embodiments, a memory system includes a semiconductor memory device and a memory controller to control the semiconductor memory device. The semiconductor memory device includes a memory cell array, an on-die error correction code (ECC) engine and a control logic circuit. The memory cell array includes a plurality of memory cells coupled to a plurality of word-lines and a plurality of bit-lines. The on-die ECC engine includes a first latch and a second latch. The control logic circuit controls the on-die ECC engine. The control logic circuit sets the semiconductor memory device to a test mode in response to a first mode register set command from the memory controller. The on-die ECC engine, in the test mode, cuts off an electrical connection with the memory cell array, receives a test data accompanied by a write command from the memory controller, stores the test data in the first latch, performs an ECC decoding on the test data stored in the first latch and a test parity data selectively including a specific error bit, stored in the second latch in response to a read command from the memory controller and provides the memory controller with a severity signal indicating whether the test data and the test parity data includes at least one error bit and indicating whether the at least one error bit is correctable, based on a result of the ECC decoding.

According to example embodiments, a semiconductor memory device includes a memory cell array, an on-die error correction code (ECC) engine and a control logic circuit. The memory cell array includes a plurality of memory cells coupled to a plurality of word-lines and a plurality of bit-lines. The on-die ECC engine includes a first latch and a second latch. The control logic circuit controls the on-die ECC engine. The control logic circuit sets the semiconductor memory device to a test mode in response to a first mode register set command from an external device. The on-die ECC engine, in the test mode, cuts off an electrical connection with the memory cell array, receives a test data accompanied by a write command from the external device, stores the test data in the first latch, performs an ECC decoding on the test data stored in the first latch and a test parity data selectively including a specific error bit, stored in the second latch in response to a read command from the external device and provides the external device with a severity signal indicating whether the test data and the test parity data includes at least one error bit and indicating whether the at least one error bit is correctable, based on a result of the ECC decoding. The on-die ECC engine includes an encoding/decoding logic, a data corrector, a parity error pattern generator and a severity signal generator. The encoding/decoding logic generates a syndrome by performing the ECC decoding on the test data stored in the first latch and the test parity data stored in the second latch in the test mode. The data corrector outputs a corrected test data by correcting a selected error bit in the test data in the test mode. The parity error pattern generator applies a parity error pattern including an error bit to a background parity data stored in the second latch, based on an error bit selection signal. The severity signal generator generates the severity signal based on the syndrome.

Accordingly, semiconductor memory device, in the test mode, cuts off an electrical connection with the memory cell array, determines whether a test parity data includes an error bit and selects a position of a parity bit including the error bit by setting of the test mode register, injects at least one error bit in the test parity data and the test data, performs an ECC decoding based on the test data and the test parity data without receiving the test parity data from the memory controller and transmits a result of the ECC decoding to the memory controller. Accordingly, the semiconductor memory device may test the on-die ECC engine with respect to various error patterns without disclosing a parity check matrix and with cutting off a connection with the memory cell array, and thus enhance test coverage.

BRIEF DESCRIPTION OF THE DRAWINGS

Example embodiments will be described below in more detail with reference to the accompanying drawings.

FIG. 5 illustrates second data bits that may be stored in the error injection register set in FIG. 4.

FIGS. 6 and 7 illustrate various error patterns that the error injection register set may represent according to example embodiments.

FIG. 10 illustrates an example of a test mode register included in the mode registers in the semiconductor memory of FIG. 8 according to example embodiments.

FIG. 17 illustrates data input to/output from the on-die ECC engine of FIG. 11 in the test mode according to example embodiments.

FIG. 18 illustrates data input to/output from the on-die ECC engine of FIG. 11 in the test mode according to example embodiments.

DETAILED DESCRIPTION

Various example embodiments will be described more fully hereinafter with reference to the accompanying drawings, in which example embodiments are shown.

Figure 1:
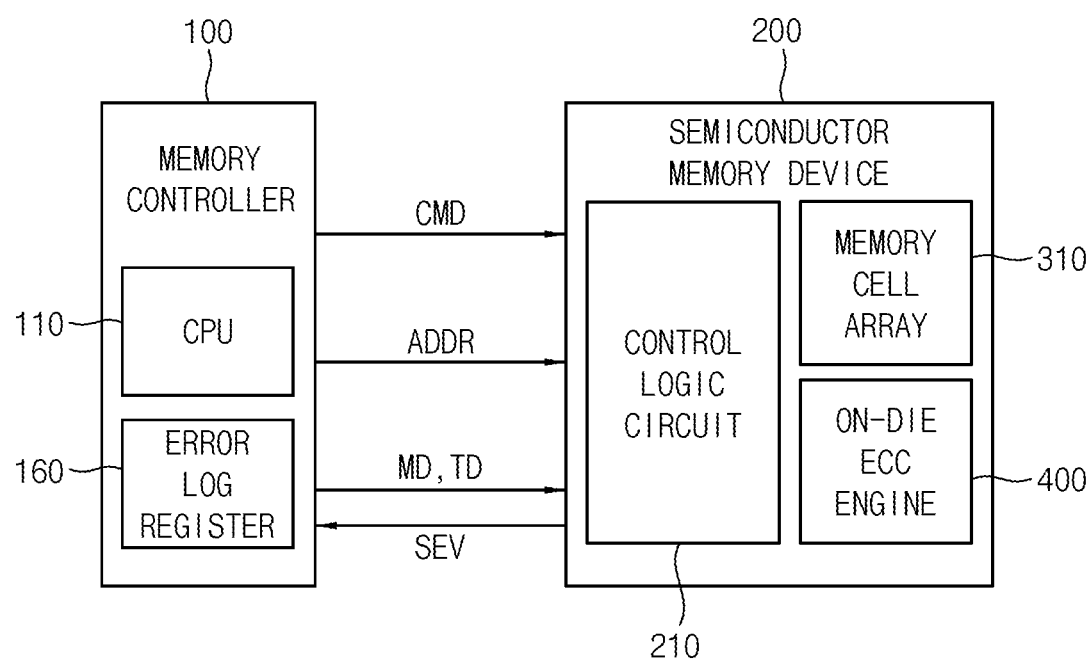
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host. The memory controller 100 may be referred to as an external device.

In addition, the memory controller 100 may issue operation commands to the semiconductor memory device 200 for controlling the semiconductor memory device 200.

In some embodiments, the semiconductor memory device 200 is a memory device including dynamic memory cells such as a dynamic random access memory (DRAM), or graphic double data rate 7 (GDDR7) synchronous DRAM (SDRAM).

The memory controller 100 may transmit a command CMD and an address (signal) ADDR to the semiconductor memory device 200, may transmit a main data MD to the semiconductor memory device 200 in a normal mode, may transmit a test data TD to the semiconductor memory device 200 in a test mode and may receive a severity signal SEV from the semiconductor memory device 200 in the test mode.

The memory controller 100 may include a central processing unit (CPU) 110 and an error log register 160.

The semiconductor memory device 200 may include a memory cell array 310 that stores the main data MD and the test data TD, an on-die error correction code (ECC) engine 400 and a control logic circuit 210.

The control logic circuit 210 may control access to the memory cell array 310 and may control the on-die ECC engine 400 based on the command CMD and the address ADDR. The memory cell array 310 may include a normal cell region and a parity cell region.

The on-die ECC engine 400, in the test mode, may cut off a connection with the memory cell array 310, may receive the test data TD accompanied by a write command from the memory controller 100, may store the test data TD in a first latch in the on-die ECC engine 400, may perform an ECC decoding on the test data TD stored in the first latch and a test parity data stored in a second latch in the on-die ECC engine 400, may perform an ECC decoding on the test data TD in response to a read command from the memory controller 100 and may provide the memory controller 100 with the severity signal SEV indicating whether the test data TD and the test parity data includes at least one error bit and indicating whether the at least one error bit is correctable based on a result of the ECC decoding. The test data TD and the test parity data may selectively include a specific error bit.

The memory controller 100 may determine whether the on-die ECC engine 400 operates normally based on the severity signal SEV and may record error information of the on-die ECC engine 400 associated with various error patterns of the test data TD and the test parity data.

Figure 2:
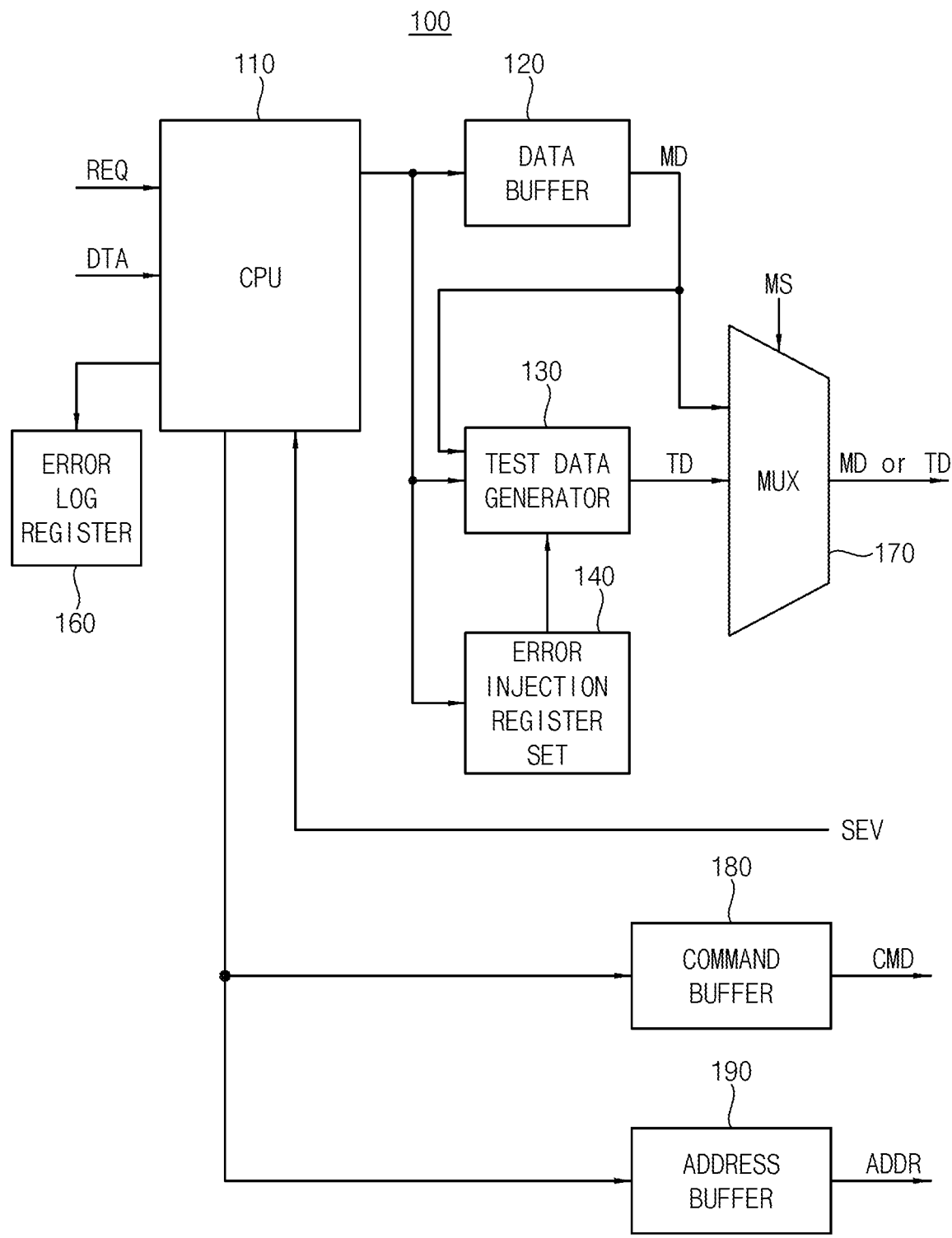
FIG. 2 is a block diagram illustrating an example of the memory controller in the memory system of FIG. 1 according to example embodiments.

FIG. 2 is a block diagram illustrating an example of the memory controller in the memory system of FIG. 1 according to example embodiments.

Referring to FIG. 2, the memory controller 100 may include the CPU 110, a data buffer 120, a test data generator 130, an error injection register 140, a multiplexer 170, a command buffer 180 and an address buffer 190.

The CPU 110 may receive a request REQ and a data DTA from the host, and may provide the data DTA to the data buffer 120. The CPU 110 may control the data buffer 120, the test data generator 130, the error injection register 140, the multiplexer 170, the command buffer 180 and the address buffer 190.

The data buffer 120 buffers the data DTA to provide the main data MD to the test data generator 130 and the multiplexer 170. The error injection register set 140 may store an error bit set including at least one error bit, and the error bit set may be associated with the test data TD to be provided to the semiconductor memory device 200.

The test data generator 130 may generate the test data TD based on the main data MD and the error bit set and may provide the test data TD to the multiplexer 170.

The multiplexer 170 may receive the main data MD and the test data TD, may select the main data MD to provide the main data MD to the semiconductor memory device 200 in the normal mode and may select the test data TD to provide the test data TD to the semiconductor memory device 200 in the test mode, in response to a mode signal MS from the CPU 110.

The command buffer 180 may store the command CMD corresponding to the request REQ and may transmit the command CMD to the semiconductor memory device 200 under control of the CPU 110. The address buffer 190 may store the address ADDR and may transmit the address ADDR to the semiconductor memory device 200 under control of the CPU 110.

Figure 3:
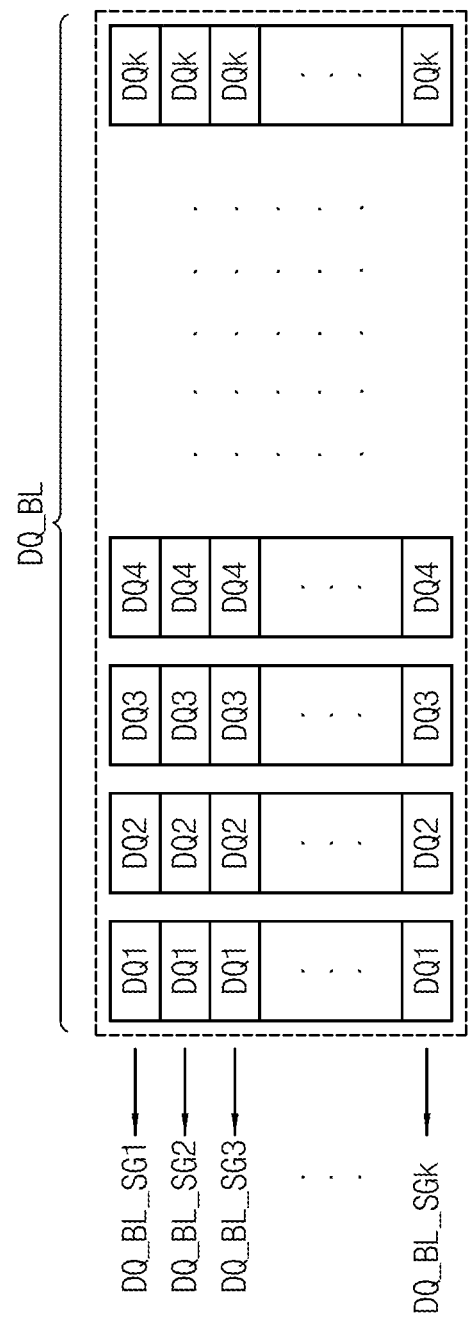
FIG. 3 illustrates a data set corresponding to a plurality of burst lengths in the memory system of FIG. 1 according to example embodiments.

FIG. 3 illustrates a data set corresponding to a plurality of burst lengths in the memory system of FIG. 1 according to example embodiments.

Referring to FIG. 3, a data set DQ_BL corresponding to a plurality of burst lengths are input to/output from the semiconductor memory device 200. The data set DQ_BL includes data segments DQ_BL_SG1~DQ_BL_SGk each corresponding to each of the plurality of burst lengths, where k is an integer greater than three. The data set DQ_BL corresponding to the plurality of burst lengths may be stored in the memory cell array 300 of the semiconductor memory device 200. The data set DQ_BL may include the main data MD and the test data TD.

Figure 4:
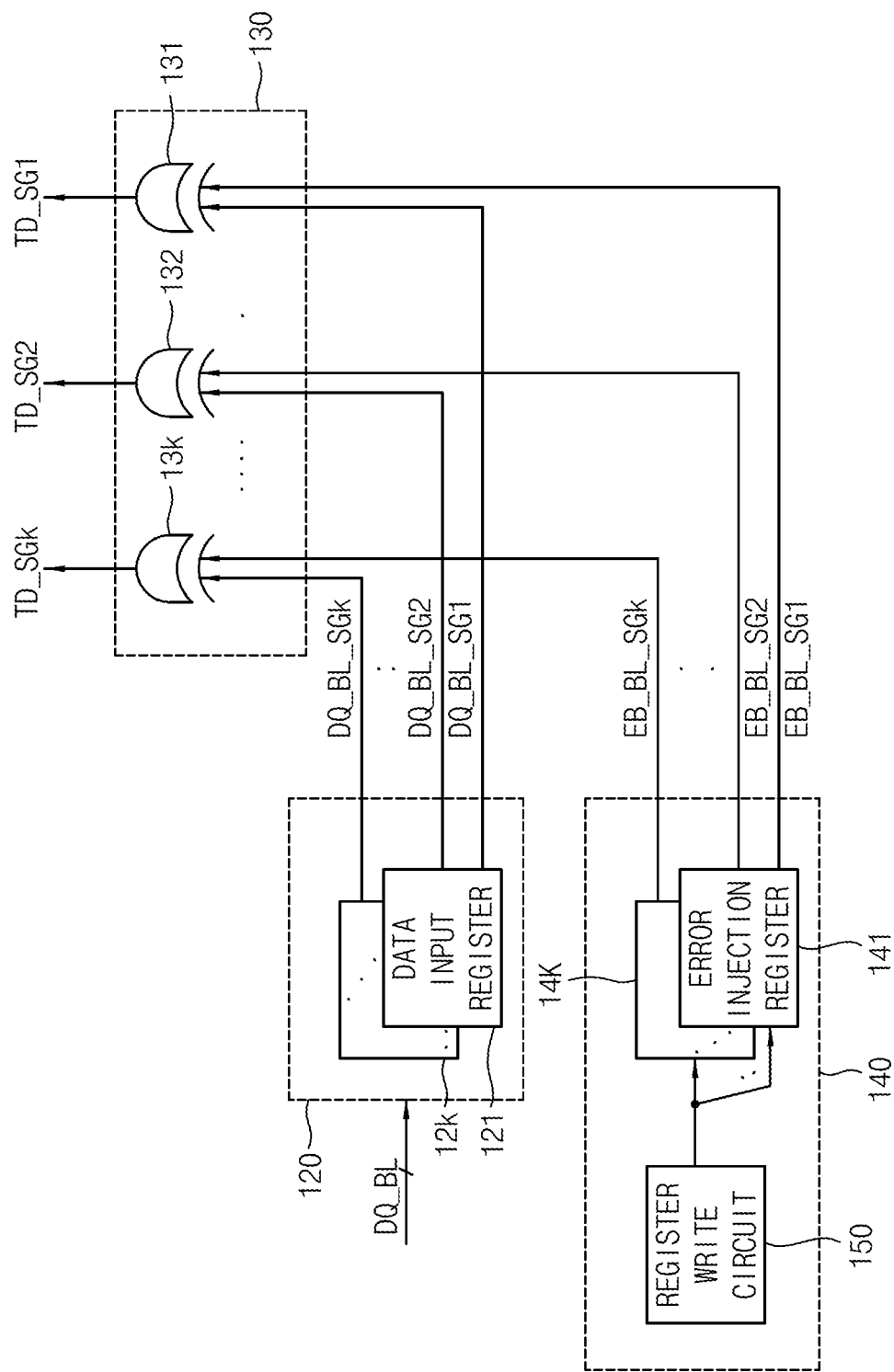
FIG. 4 illustrates the error injection register set, the data buffer and the test data generator in the memory controller of FIG. 2 according to example embodiments.

FIG. 4 illustrates the error injection register set, the data buffer and the test data generator in the memory controller of FIG. 2 according to example embodiments.

Referring to FIG. 4, the error injection register set 140 may include a register write circuit 150 and a plurality of error injection registers 141~14k. The data buffer 120 may include a plurality of data input registers 121~12k. Each of the data input registers 121~12k may store corresponding ones of first units of first data bits DQ_BL_SG1~DQ_BL_SGk, corresponding to a burst length of the semiconductor memory device 200, in the data set DQ_BL. Each of the data input registers 121~12k may provide the test data generator 130 with corresponding one of first units of first data bits DQ_BL_SG1~DQ_BL_SGk in the data set DQ_BL.

Each of the error injection registers 141~14k may store corresponding ones of second units of second data bits EB_BL_SG1~EB_BL_SGk corresponding to each of the data input registers 121~12k and to each of the first units of first data bits DQ_BL_SG1~DQ_BL_SGk. Size of the first unit may be the same as a size of the second unit.

The register write circuit 150 may maintain the second data bits stored in the error injection registers 141~14k at a default level (a first logic level, i.e., a logic low level) or may change at least one of the second data bits to a second logic level based on a control of the CPU 110.

The test data generator 130 may include a plurality of exclusive OR gates 131~13k.

The plurality of exclusive OR gates 131~13k may perform an exclusive OR operation on corresponding data bits of the first units of first data bits DQ_BL_SG1~DQ_BL_SGk and the second units of second data bits EB_BL_SG1~EB_BL_SGk respectively to generate test data TD_SG1~TD_SGk.

FIG. 5 illustrates second data bits that may be stored in the error injection register set in FIG. 4.

Referring to FIG. 5, second data bits V having a first logic level as a default logic level may be stored in the error injection registers 141~14k in the error injection register set 140. The register write circuit 150 may change at least one of the second data bits V to a second logic level such that the test data TD_SG1~TD_SGk representing various error patterns may be provided to the semiconductor memory device 200.

FIGS. 6 and 7 illustrate various error patterns that the error injection register set may represent according to example embodiments.

FIG. 6 illustrates a single bit error.

Referring to FIG. 6, only one of the second data bits EB_BL_SG1~EB_BL_SGk has a logic high level. Therefore, it is noted that the error pattern of FIG. 6 represents a single bit error.

FIG. 7 illustrates a double bit error.

Referring to FIG. 7, two of the second data bits EB_BL_SG1~EB_BL_SGk have a logic high level. Therefore, it is noted that the error pattern of FIG. 7 represents a double bit error.

Figure 8:
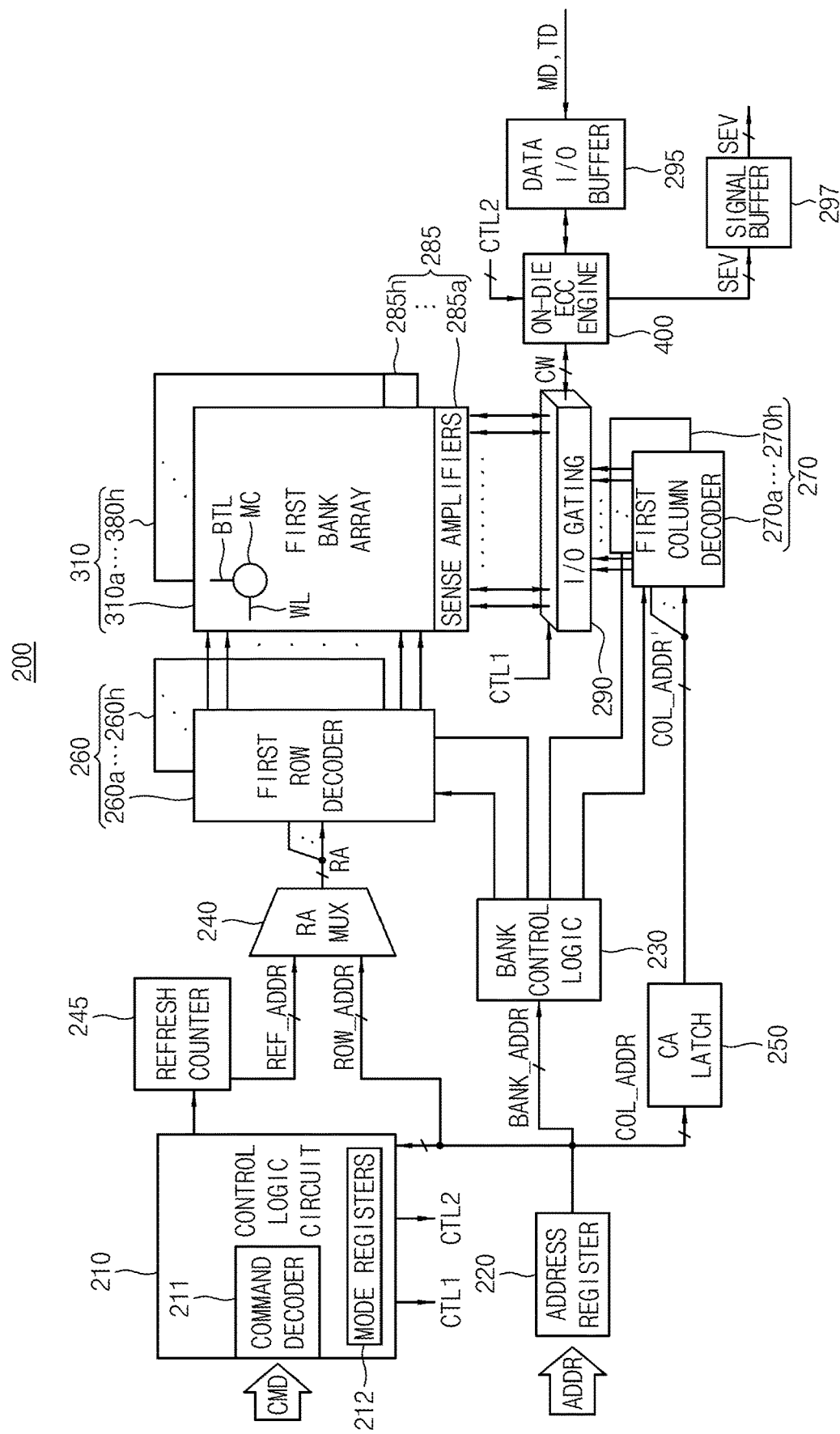
FIG. 8 is a block diagram illustrating an example of the semiconductor memory device in the memory system of FIG. 1 according to example embodiments.

FIG. 8 is a block diagram illustrating an example of the semiconductor memory device in the memory system of FIG. 1 according to example embodiments.

Referring to FIG. 8, the semiconductor memory device 200 may include the control logic circuit 210, an address register 220, a bank control logic 230, a refresh counter 245, a row address multiplexer 240, a column address latch 250, a row decoder 260, a column decoder 270, the memory cell array 310, a sense amplifier unit 285, an input/output (I/O) gating circuit 290, the on-die ECC engine 400, a data I/O buffer 295 and a signal buffer 297.

The memory cell array 310 may include first through eighth bank arrays 310a~310h. The row decoder 260 may include first through eighth bank row decoders 260a~260h respectively coupled to the first through eighth bank arrays 310a~310h, the column decoder 270 may include first through eighth bank column decoders 270a~270h respectively coupled to the first through eighth bank arrays 310a~310h, and the sense amplifier unit 285 may include first through eighth bank sense amplifiers 285a~285h respectively coupled to the first through eighth bank arrays 310a~310h.

The first through eighth bank arrays 310a~310h, the first through eighth bank row decoders 260a~260h, the first through eighth bank column decoders 270a~270h and first through eighth bank sense amplifiers 285a~285h may form first through eighth banks. Each of the first through eighth bank arrays 310a~310h may include a plurality of volatile memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 selectively may output the row address ROW_ADDR or the refresh row address REF_ADDR as a row address RA. The row address RA that is output from the row address multiplexer 240 may be applied to the first through eighth bank row decoders 260a~260h.

The refresh counter 245 may sequentially increase or decrease the refresh row address REF_ADDR under control of the control logic circuit 210.

When the command CMD from the memory controller 100 corresponds to an auto refresh command or a self-refresh entry command, the control logic circuit 210 may control the refresh counter 245 to output the refresh row address REF_ADDR sequentially.

The activated one of the first through eighth bank row decoders 260a~260h, by the bank control logic 230, may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses COL_ADDR' that increments from the received column address COL_ADDR. The column address latch 250 may apply the temporarily stored or generated column address COL_ADDR' to the first through eighth bank column decoders 270a~270h.

The activated one of the first through eighth bank column decoders 270a~270h may activate a sense amplifier corresponding to the bank address BANK_ADDR and the column address COL_ADDR' through the I/O gating circuit 290.

The I/O gating circuit 290 may include a circuitry for gating input/output data, and further includes input data mask logic, read data latches for storing data that is output from the first through eighth bank arrays 310a~310h, and write drivers for writing data to the first through eighth bank arrays 310a~310h.

Codeword CW read from one bank array of the first through eighth bank arrays 310a~310h may be sensed by a sense amplifier coupled to the one bank array from which the data is to be read, and may be stored in the read data latches. The codeword CW stored in the read data latches may be provided to the memory controller 100 via the data I/O buffer 295 after ECC decoding is performed on the codeword CW by the on-die ECC engine 400.

The main data MD to be written in one bank array of the first through eighth bank arrays 310a~310h may be provided to the data I/O buffer 295 from the memory controller 100, may be provided to the on-die ECC engine 400 from the data I/O buffer 295, the on-die ECC engine 400 may perform an ECC encoding on the main data MD to generate parity data, the on-die ECC engine 400 may provide the main data MD and the parity data to the I/O gating circuit 290 and the I/O gating circuit 290 may write the main data MD and the parity data in a sub-page of a target page in one bank array through the write drivers.

The data I/O buffer 295 may provide the main data MD from the memory controller 100 to the on-die ECC engine 400 in a write operation of a normal mode of the semiconductor memory device 200, may provide the test data TD that selectively includes at least one error bit in a write operation of the test mode of the semiconductor memory device 200.

The on-die ECC engine 400, in the write operation of the normal mode, may receive the main data MD accompanied by a write command, may perform an ECC encoding on the main data MD to generate the parity data and may store the codeword CW including the main data MD and the parity data in a normal cell region and a parity cell region of a target bank, respectively through the I/O gating circuit 290.

The on-die ECC engine 400, in the test mode, may update the test data TD including one error bit in a first latch in the on-die ECC engine 400, may perform an ECC decoding on the test data TD stored in the first latch and a test parity data stored in a second latch in response to a read command, may generate the severity signal SEV based on a result of the ECC decoding, and may provide the severity signal SEV to the memory controller 100 through the signal buffer 297.

The control logic circuit 210 may control operations of the semiconductor memory device 200. For example, the control logic circuit 210 may generate control signals for the semiconductor memory device 200 in order to perform a write operation, a read operation and operation in the test mode. The control logic circuit 210 may include a command decoder 211 that decodes the command CMD received from the memory controller 100 and mode registers 212 that set an operation mode of the semiconductor memory device 200.

For example, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the I/O gating circuit 290 and a second control signal CTL2 to control the on-die ECC engine 400 by decoding the command CMD.

Figure 9:
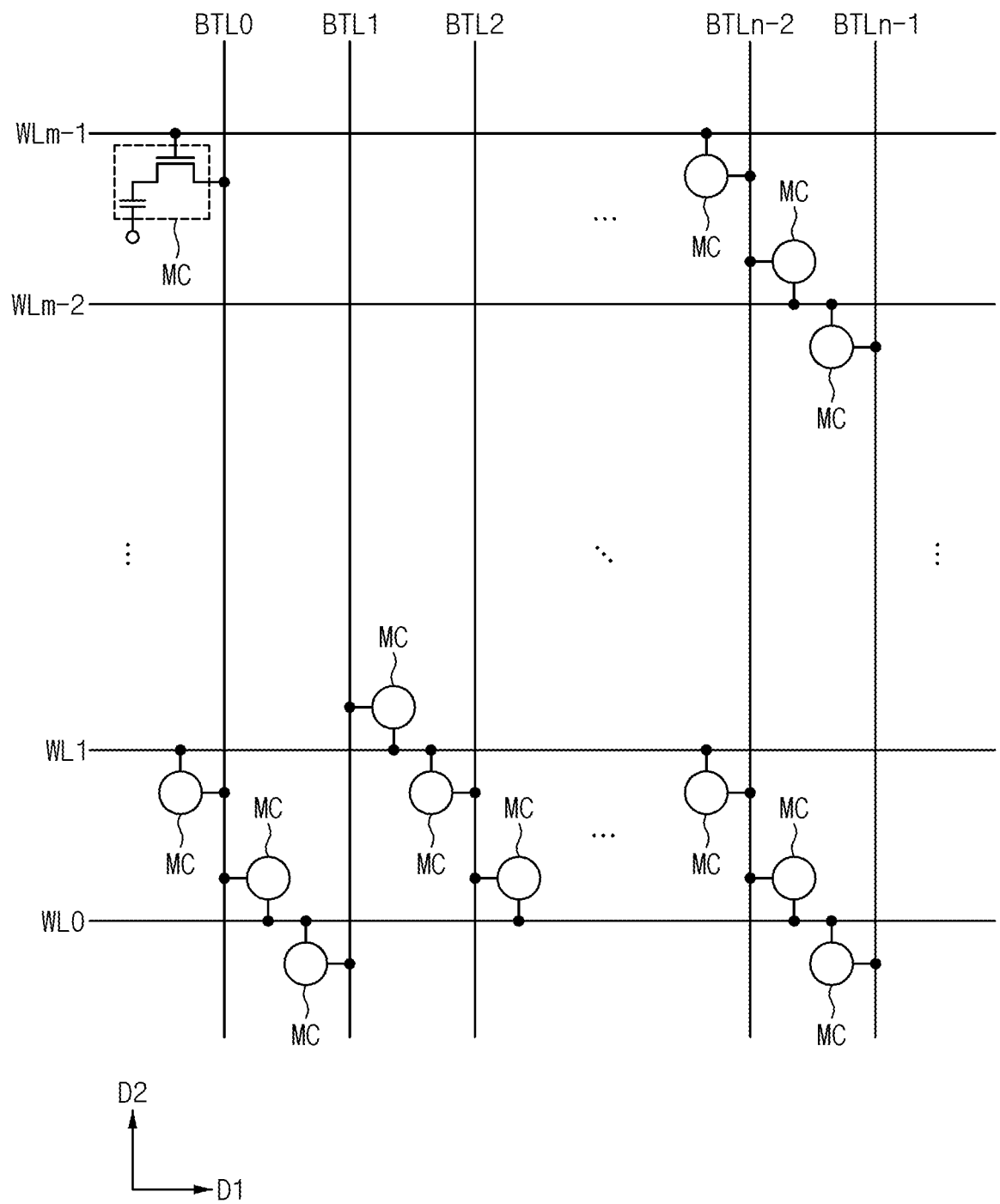
FIG. 9 illustrates an example of the first bank array in the semiconductor memory device of FIG. 8 according to example embodiments.

FIG. 9 illustrates an example of the first bank array in the semiconductor memory device of FIG. 8 according to example embodiments.

Referring to FIG. 9, the first bank array 310 may include a plurality of word-lines WL0~WLm-1 (where m is an even number equal to or greater than two), a plurality of bit-lines BTL0~BTLn-1 (where n is an even number equal to or greater than two), and a plurality of memory cells MCs disposed at intersections between the word-lines WL0~WLm-1 and the bit-lines BTL0~BTLn-1.

The word-lines WL0~WLm-1 may extend in a first direction D1 and the w bit-lines BTL0~BTLn-1 may extend in a second direction D2.

Each of the memory cells MCs includes an access (cell) transistor coupled to one of the word-lines WL0~WLm-1 and one of the bit-lines BTL0~BTLn-1 and a storage (cell) capacitor coupled to the cell transistor. That is, each of the memory cells MCs has a DRAM cell structure.

In addition, the memory cells MCs may have different arrangements depending on if the memory cells MCs are coupled to an even word-line (for example, WL0) or an odd word-line (for example, WL1). That is, a bit-line coupled to adjacent memory cells may be different depending on whether a word-line selected by an access address is an even word-line or an odd word-line.

FIG. 10 illustrates an example of a test mode register included in the mode registers in the semiconductor memory of FIG. 8 according to example embodiments.

Referring to FIG. 10, a test mode register MRx may store a plurality of operation codes OP[6:0].

A first operation code OP[6] of the plurality of operation codes OP[6:0] may set whether to enter into an ECC error injection mode ECC Error Injection. When the first operation code OP[6] has a first logic level (i.e., a logic low level), the semiconductor memory device 200 may perform a normal operation and when the first operation code OP[6] has a second logic level (i.e., a logic high level), the semiconductor memory device 200 may enter into the test mode and may operate in the ECC error injection mode.

When operation mode of the semiconductor memory device 200 is set to the ECC error injection mode by the first operation code OP[6], a type of a background data stored in a first latch (423 in FIG. 11) by a second operation code OP[5] of the plurality of operation codes OP[6:0]. When the second operation code OP[5] has a first logic level, the background data having a first type associated with a first codeword CW0 may be stored in the first latch 423 and when the second operation code OP[5] has a second logic level, the background data having a second type associated with a second codeword CW1 may be stored in the first latch 423.

Because all data bits in the background data having the first type have a low level, a high level bit may indicate an error bit, and because all data bits in the background data having the second type have a high level, a low level bit may indicate an error bit.

When the operation mode of the semiconductor memory device 200 is set to the ECC error injection mode, a third operation code OP[4] of the plurality of operation codes OP[6:0] may set whether a test parity data includes an error bit. When the third operation code OP[4] has a first logic level, the test parity data includes no error bit and when the third operation code OP[4] has a second logic level, the test parity data includes an error bit (i.e., a parity error).

When the operation mode of the semiconductor memory device 200 is set to the ECC error injection mode and the test parity data is set to include the error bit, fourth through seventh operation codes OP[3:0] of plurality of operation codes OP[6:0] may set (i.e., may select) a position of a parity bit including the error bit from among parity bits of the test parity data as denoted by Parity_sel.

If the test parity data includes 16-bit parity bits and fourth through seventh operation codes OP[3:0] correspond to [0000], an error mask corresponds to [1000000000000000]. The test parity data may be generated by performing XOR operation on the error mask and the background data by a second latch (427 in FIG. 11).

Therefore, the test mode register MRx according to example embodiments, in the test mode, may set a type of the background data, whether the test parity data include an error bit and a positon of the error bit in the test parity data.

Accordingly, the memory controller 100 may test a case in which the test parity data includes an error bit in addition to testing a case in which the test data includes an error bit, and thus may enhance test coverage.

Figure 11:
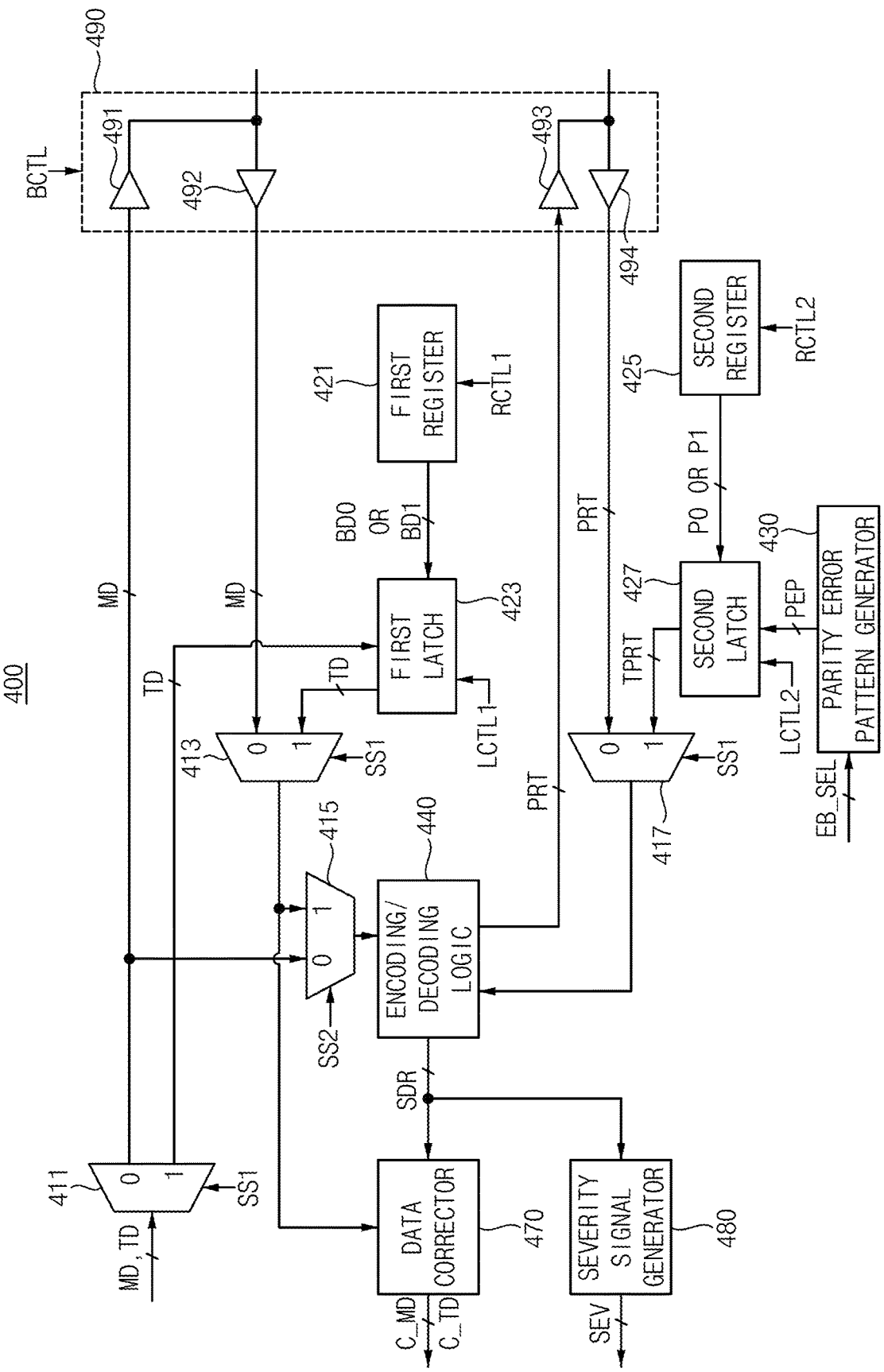
FIG. 11 is a block diagram illustrating an example of the on-die ECC engine in the semiconductor memory device of FIG. 8 according to example embodiments.

FIG. 11 is a block diagram illustrating an example of the on-die ECC engine in the semiconductor memory device of FIG. 8 according to example embodiments.

Referring to FIG. 11. the on-die ECC engine 400 may include a demultiplexer 411, a first multiplexer 413, a second multiplexer 415, a third multiplexer 417, a first register 421, a first latch 423, a second register 425, a second latch 427, a parity error pattern generator 430, an encoding/decoding logic 440, a data corrector 470, a severity signal generator 480, and a buffer circuit 490.

The buffer circuit 490 may include buffers 491, 492, 493 and 494. The buffers 491, 492, 493 and 494 may be controlled by a buffer control signal BCTL.

The demultiplexer 411 may receive the main data MD and may provide the main data MD to the second multiplexer 415 and the memory cell array 310 through the buffer 491 in the buffer circuit 490 in response to a first selection signal SS1 in the normal mode. The demultiplexer 411 may receive the test data TD and may provide (i.e., update) the test data TD to the first latch 423 in the test mode, in response to the first selection signal SS1.

The first multiplexer 413 may receive the main data MD from the memory cell array 310 through the buffer 192 and may output the main data MD to the second multiplexer 415 and the data corrector 470 in the normal mode in response to the first selection signal SS1. The first multiplexer 413 may receive the test data TD stored in the first latch 423 and output the test data TD to the second multiplexer 415 and the data corrector 470 in the test mode in response to the first selection signal SS1.

The second multiplexer 415 may provide the main data MD to the encoding/decoding logic 440 in the write operation of the normal mode and may provide an output of the first multiplexer 413 to the encoding/decoding logic 440 in the test mode, in response to a second selection signal SS2.

The third multiplexer 417 may provide parity data PRT from the memory cell array 310 through the buffer 494 to the encoding/decoding logic 440 in the normal mode and may provide the encoding/decoding logic 440 with a test parity data TPRT received from the second latch 427 in the test mode, in response to the first selection signal SS1.

The first register 421 may store a first type of background data BD0 and a second type of background data BD1 and may provide with the first latch 423 with one of the first type of background data BD0 and the second type of background data BD1 as a background data based on a first register control signal RCTL1 set by the second operation code OP[5] in the test mode.

The first latch 423, in the test mode, may store one of the first type of background data BD0 and the second type of background data BD1, may be updated by the test data TD and may provide the test data TD to the first multiplexer 413 in a first latch control signal LCTL1.

The second register 425 may store a first type of background parity data P0 and a second type of background parity data P1 and may provide with the second latch 427 with one of the first type of background parity data P0 and the second type of background parity data P1 based on a second register control signal RCTL2 set by the second operation code OP[5] in the test mode.

The second latch 427, in the test mode, may store one of the first type of background parity data P0 and the second type of background parity data P1, may be inserted with an error bit by a parity error pattern PEP and may provide the test parity data TPRT to the third multiplexer 417 in a second latch control signal LCTL2.

The parity error pattern generator 430 may apply the parity error pattern PEP including an error bit to a background parity data stored in the second latch 427, based on an error bit selection signal EB_SEL corresponding to fourth through seventh operation codes OP[3:0]. The error bit selection signal EB_SEL may set a position of the error bit included in the parity error pattern PEP, the parity error pattern generator 430 may provide the parity error pattern PEP to the second latch 427 and the second latch 427 may generate the test parity data TPRT by performing an XOR operation on the background parity data corresponding to one of the first type of background parity data P0 and the second type of background parity data P1 and the parity error pattern PEP.

The encoding/decoding logic 440 may receive the main data MD from the second multiplexer 415 in the write operation of the normal mode, may generate the parity data PRT by performing an ECC encoding on the main data MD, and may provide the parity data PRT to the memory cell array 310 through the buffer 493. The encoding/decoding logic 440, in a read operation of the normal mode, may receive the main data MD from the second multiplexer 415, may receive the parity data PRT from the third multiplexer 417, may generate a syndrome SDR by performing an ECC decoding on the main data MD and the parity data PRT and may provide the syndrome SDR to the data corrector 470 and the severity signal generator 480.

The encoding/decoding logic 440, in a read operation of the test mode, may receive the test data TD from the second multiplexer 415, may receive the test parity data TPRT from the third multiplexer 417, may generate the syndrome SDR by performing an ECC decoding on the test data TD and the test parity data TPRT and may provide the syndrome SDR to the data corrector 470 and the severity signal generator 480.

The data corrector 470, in the read operation of the normal mode, may receive the main data MD and may output a corrected data C_MD by correcting one error bit based on the syndrome SDR in the main data MD. The data corrector 470, in the read operation of the test mode, may receive the test data TD and may output a corrected test data C_TD by correcting one error bit based on the syndrome SDR in the test data TD.

The severity signal generator 480 may generate the severity signal SEV indicating whether the main data MD or the test data TD includes an error bit and whether the error bit is correctable.

The first selection signal SS1, the second selection signal SS2, the buffer control signal BCTL, the first register control signal RCTL1, the second register control signal RCTL2, the first latch control signal LCTL1, the second latch control signal LCTL2 and the error bit selection signal EB_SEL in FIG. 11 may be included in the second control signal CTL2 in FIG. 8.

Figure 12:
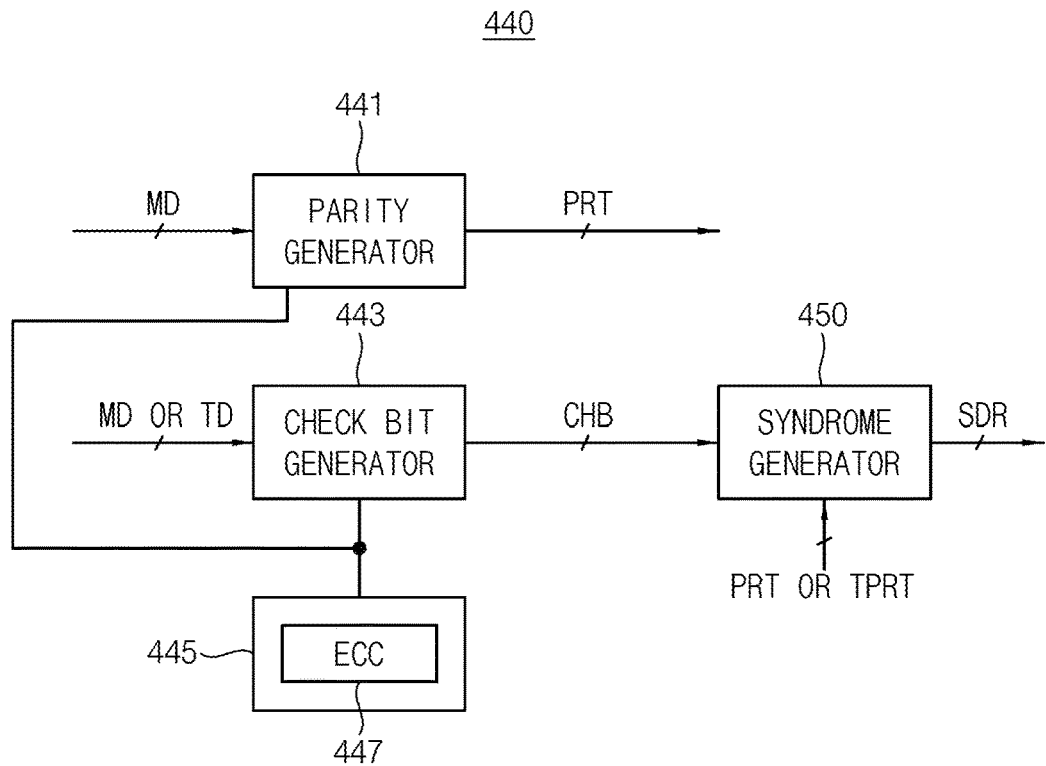
FIG. 12 illustrates an example of the encoding/decoding logic in the on-die ECC engine of FIG. 11 according to example embodiments.

FIG. 12 illustrates an example of the encoding/decoding logic in the on-die ECC engine of FIG. 11 according to example embodiments.

Referring to FIG. 12, the encoding/decoding logic 440 may include a parity generator 441, a check bit generator 443, a syndrome generator 450 and a memory 445.

The parity generator 441 may be connected to an ECC 447 in the memory 445 and may generate the parity data PRT based on the main data MD using an array of exclusive OR gates.

The check bit generator 443 may be connected to the ECC 447 in the memory 445 and may generate check bits CHB based on the main data MD in the read operation of the normal mode and may generate the check bits CHB based on the test data TD in the read operation of the test mode. The syndrome generator 450 may generate the syndrome data SDR based on the check bits CHB based on the main data MD and the parity data PRT from the buffer 494 of FIG. 11 and may generate the syndrome data SDR based on the check bits CHB based on the test data TD and the test parity data TPRT from the second latch 427. The syndrome generator 450 may generate the syndrome SDR based on whether each of the check bits CHB is equal to a corresponding one of bits of the parity data PRT or the test parity data TPRT.

The syndrome SDR may include a plurality of syndrome bits and each of the plurality of syndrome bits may indicate whether each of the check bits CHB is equal to a corresponding one of bits of the parity data PRT or the test parity data TPRT. Therefore, the syndrome SDR may indicate a position of the error bit and a number of the error bit.

Figure 13:
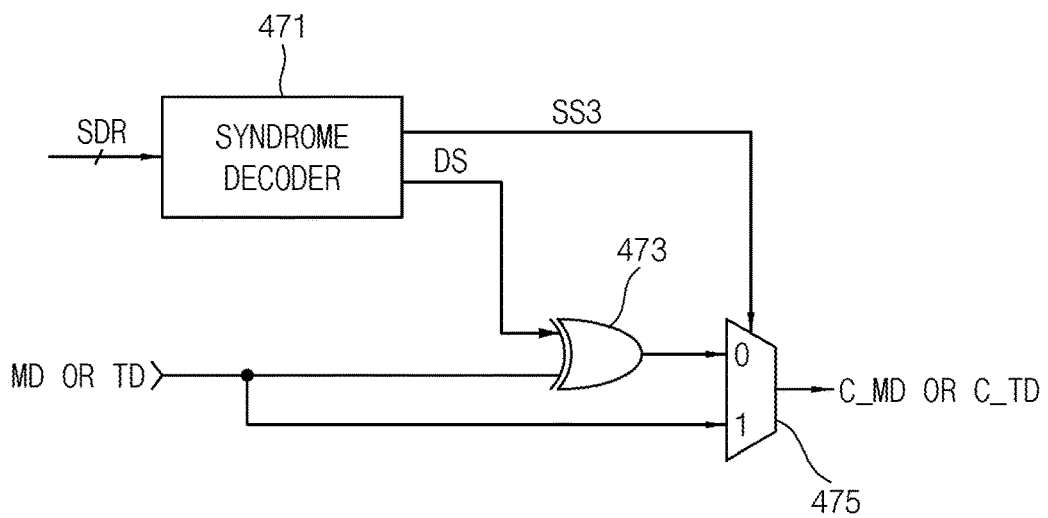
FIG. 13 illustrates an example of the data corrector in the on-die ECC engine of FIG. 11 according to example embodiments.

FIG. 13 illustrates an example of the data corrector in the on-die ECC engine of FIG. 11 according to example embodiments.

Referring to FIG. 13, the data corrector 470 may include a syndrome decoder 471, a bit inverter 473 and a selection circuit 475 which is implemented by a multiplexer.

The syndrome decoder 471 may decode the syndrome SDR to generate a decoding signal DS and a third selection signal SS3. The decoding signal DS may indicate a position of the at least one error and the third selection signal SS3 may have a logic level depending on a number of the at least one error bit. The bit inverter 473 may invert the at least one error bit in response to the decoding signal DS. The selection circuit 475 may select one of the main data MD and an output of the bit inverter 473 to provide the corrected main data C_MD in response to the third selection signal SS3 in the normal mode and may select one of the test data TD and an output of the bit inverter 473 to provide the corrected test data C_TD in response to the third selection signal SS3 in the test mode.

Figure 14:
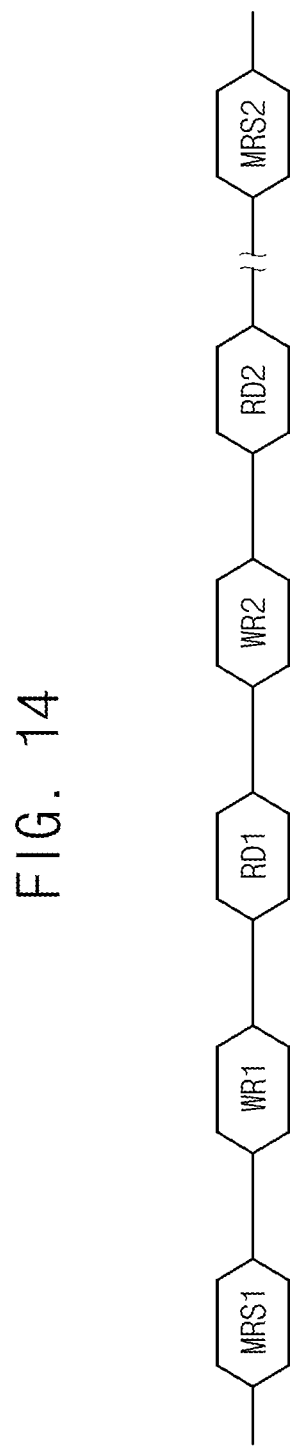
FIG. 14 illustrates a command sequence that the semiconductor memory device receives in the test mode.
Figure 15:
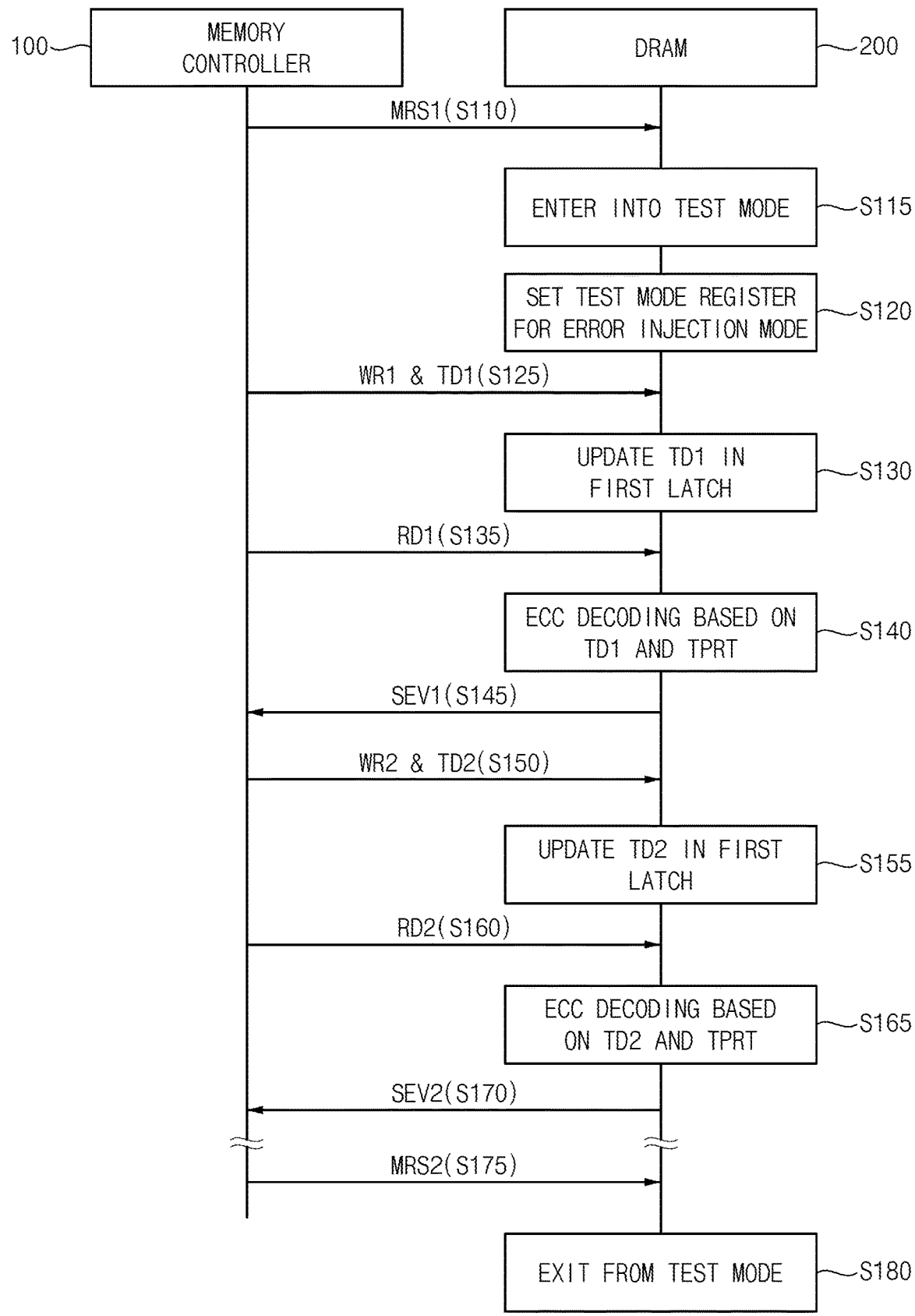
FIG. 15 illustrates an operation of the memory system of FIG. 1 in the test mode, according to example embodiments.

FIG. 14 illustrates a command sequence that the semiconductor memory device receives in the test mode and FIG. 15 illustrates an operation of the memory system of FIG. 1 in the test mode, according to example embodiments.

Referring to FIGS. 1, 10, 11, 14 and 15, the memory controller 100 applies a first mode register set command MRS1 to the semiconductor memory device 200 (operation S110) such that the semiconductor memory device 200 enters into the test mode (operation S115) and the plurality of operation codes OP[6:0] in the test mode register MRx may be set to the error injection mode (operation S120). In response to the plurality of operation codes OP[6:0] being set to the error injection mode, the first latch 423 stores one of the first type of background data BD0 and the second type of background data BD1 and the second latch 427 stores one of the first type of background parity data P0 and the second type of background parity data P1.

The memory controller 100 applies a first write command WR1 and a first test data TD1 to the semiconductor memory device 200 (operation S125) and the on-die ECC engine 400 updates the first latch 423 by storing the first test data TD1 in the first latch 423 (operation S130) and updates the second latch 427 by apply the parity error pattern PEP to the second latch 427.

The memory controller 100 applies a first read command RD1 to the semiconductor memory device 200 (operation S135), and the on-die ECC engine 400 performs an ECC decoding on the first test data TD1 stored in the first latch 423 and the test parity data TPRT stored in the second latch 427, generates a severity signal SEV1 based on a result of the ECC decoding and transmits the severity signal SEV1 to the memory controller 100 (operation S145).

The memory controller 100 applies a second write command WR2 and a second test data TD2 to the semiconductor memory device 200 (operation S150) and the on-die ECC engine 400 updates the first latch 423 by storing the second test data TD2 in the first latch 423 (operation S155).

The memory controller 100 applies a second read command RD2 to the semiconductor memory device 200 (operation S160), and the on-die ECC engine 400 performs an ECC decoding on the second test data TD2 stored in the first latch 423 and the test parity data TPRT stored in the second latch 427, generates a severity signal SEV2 based on a result of the ECC decoding and transmits the severity signal SEV2 to the memory controller 100 (operation S170).

The above-mentioned process is repeated on various test data and various test parity data, the memory controller 100 applies a second mode register set command MRS2 to the semiconductor memory device 200 (operation S175) and the semiconductor memory device 200 exits from the test mode in response to the second mode register set command MRS2 (operation S180).

Figure 16:
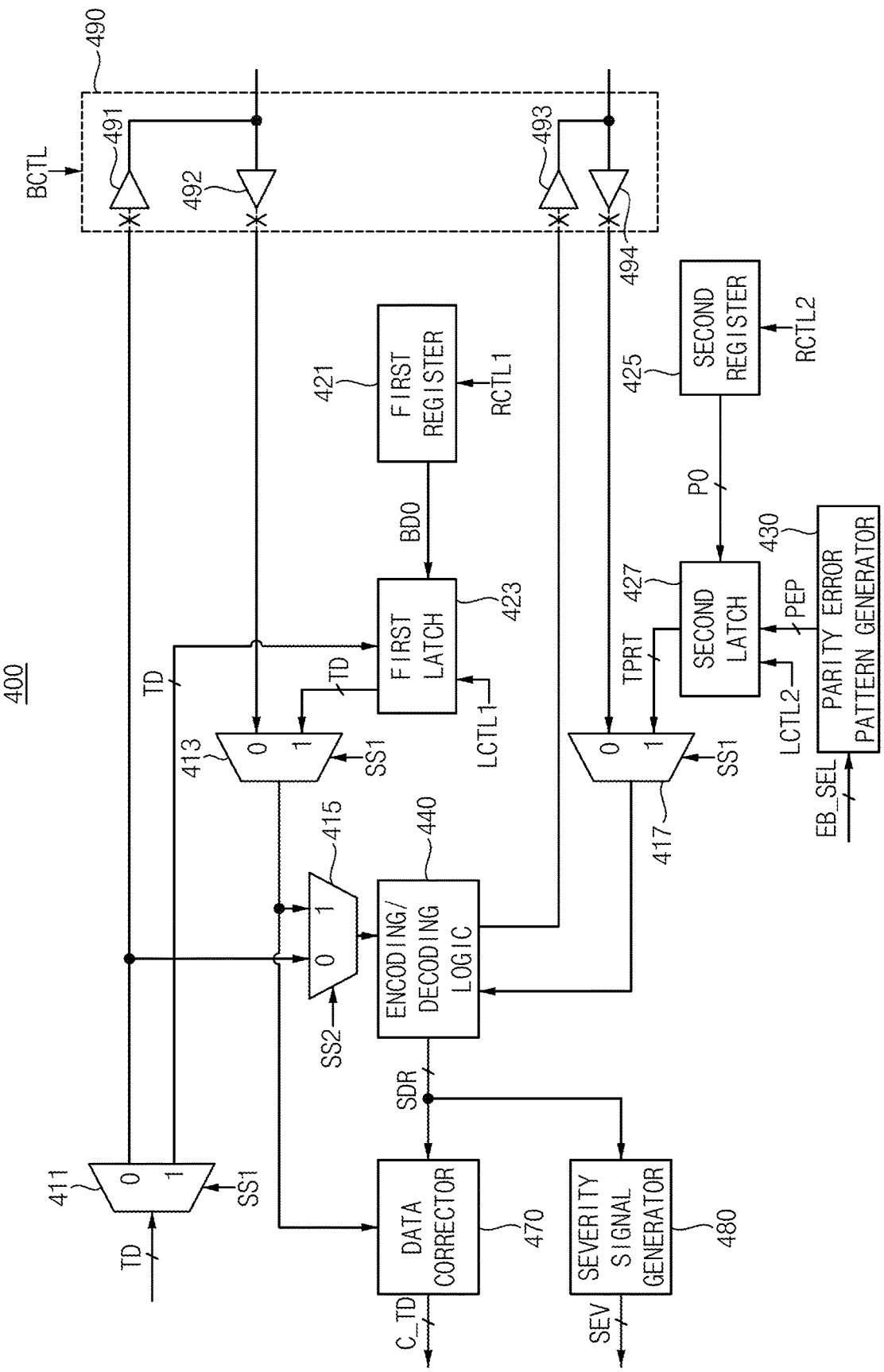
FIG. 16 illustrates an operation of the on-die ECC engine of FIG. 11 in the test mode according to example embodiments.

FIG. 16 illustrates an operation of the on-die ECC engine of FIG. 11 in the test mode according to example embodiments.

In FIG. 16, assuming that the first latch 423 stores the first type of background data BD0 and the second latch 427 stores the first type of background parity data P0, according to the setting by the test mode register MRx.

Referring to FIG. 16, the buffer circuit 490 cuts off connection between the on-die ECC engine 400 and the memory cell array 310 based on the buffer control signal BCTL in the test mode.

The test data TD accompanied by the write command from the memory controller 100 is stored in the first latch 423 and the first latch is updated. The parity error pattern PEP based on the error bit selection signal EB_SEL is stored in the second latch 427 and the second latch 427 is updated.

The encoding/decoding logic 440 generates the syndrome SDR by performing the ECC decoding on the test data TD stored in the first latch 423 and the test parity data TPRT stored in the second latch 427 in response to the read command from the memory controller 100 and the severity signal generator 480 generates the severity signal SEV based on the syndrome SDR. The data corrector 470 outputs the corrected test data C_TD by correcting one error bit in the test data TD based on the syndrome SDR.

FIG. 17 illustrates data input to/output from the on-die ECC engine of FIG. 11 in the test mode according to example embodiments.

In FIG. 17, assuming that the first latch 423 stores the first type of background data BD0 and the second latch 427 stores the first type of background parity data P0 according to the setting by the test mode register MRx.

In FIG. 17, Error Pattern Input may correspond to the test data TD in FIG. 16, Error Pattern Output may correspond to the corrected test data C_TD in FIG. 16, Parity Error may correspond to the test parity data TPRT in FIG. 16, SEV Result may correspond to the severity signal SEV in FIG. 16 and Expected SEV may correspond to expected severity signal that the CPU 110 expects with respect to various error patterns. A logic high level in the Error Pattern Input and the Error Pattern Output may indicate an error bit.

In FIG. 17, assuming that the each of Error Pattern Input and Error Pattern Output includes 256 bits and Parity Error includes 16 bits.

Referring to FIG. 17, when Error Pattern Input and Parity Error include no error bits, the severity signal generator 480 in FIG. 16 transmits, to the memory controller 100, the severity signal SEV indicating that no error bits are detected (NE) and the CPU 110 determines whether the on-die ECC engine 400 operates normally based on a comparison of the severity signal SEV indicating that no error bits are detected (NE) and the expected severity signal.

When one of Error Pattern Input and Parity Error includes one error bit, the severity signal generator 480 in FIG. 16 transmits, to the memory controller 100, the severity signal SEV indicating that the one error bit is correctable (or, corrected) (CE) and the CPU 110 determines whether the on-die ECC engine 400 operates normally based on a comparison of the severity signal SEV indicating that the one error bit is corrected (CE) and the expected severity signal.

When Error Pattern Input includes two or more one error bits and each of Error Pattern Input and Parity Error includes an error bit, the severity signal generator 480 in FIG. 16 transmits, to the memory controller 100, the severity signal SEV indicating that error bits are uncorrectable (UE) and the CPU 110 determines whether the on-die ECC engine 400 operates normally based on a comparison of the severity signal SEV indicating that the error bits are uncorrected (UE) and the expected severity signal.

When the severity signal SEV is different from the expected severity signal, the CPU 110 determines that the on-die ECC engine 400 operates abnormally.

FIG. 18 illustrates data input to/output from the on-die ECC engine of FIG. 11 in the test mode according to example embodiments.

In FIG. 18, assuming that the first latch 423 stores the second type of background data BD1 and the second latch 427 stores the second type of background parity data P1 according to setting by the test mode register MRx.

In FIG. 18, Error Pattern Input may correspond to the test data TD in FIG. 16, Error Pattern Output may correspond to the corrected test data C_TD in FIG. 16, Parity Error may correspond to the test parity data TPRT in FIG. 16, SEV Result may correspond to the severity signal SEV in FIG. 16 and Expected SEV may correspond to expected severity signal that the CPU 110 expects with respect to various error patterns. A logic low level in the Error Pattern Input and the Error Pattern Output may indicate an error bit.

In FIG. 18, assuming that the each of Error Pattern Input and Error Pattern Output includes 256 bits and Parity Error includes 16 bits.

Referring to FIG. 18, when Error Pattern Input and Parity Error include no error bits, the severity signal generator 480 in FIG. 16 transmits, to the memory controller 100, the severity signal SEV indicating that no error bits are detected (NE) and the CPU 110 determines whether the on-die ECC engine 400 operates normally based on a comparison of the severity signal SEV indicating that no error bits are detected (NE) and the expected severity signal.

When one of Error Pattern Input and Parity Error includes one error bit, the severity signal generator 480 in FIG. 16 transmits, to the memory controller 100, the severity signal SEV indicating that the one error bit is correctable (or, corrected) (CE) and the CPU 110 determines whether the on-die ECC engine 400 operates normally based on a comparison of the severity signal SEV indicating that the one error bit is corrected (CE) and the expected severity signal.

When Error Pattern Input includes two or more one error bits and each of Error Pattern Input and Parity Error includes an error bit, the severity signal generator 480 in FIG. 16 transmits, to the memory controller 100, the severity signal SEV indicating that error bits are uncorrectable (UE) and the CPU 110 determines whether the on-die ECC engine 400 operates normally based on a comparison of the severity signal SEV indicating that the error bits are uncorrected (UE) and the expected severity signal.

When the severity signal SEV is different from the expected severity signal, the CPU 110 determines that the on-die ECC engine 400 operates abnormally.

Figure 19:
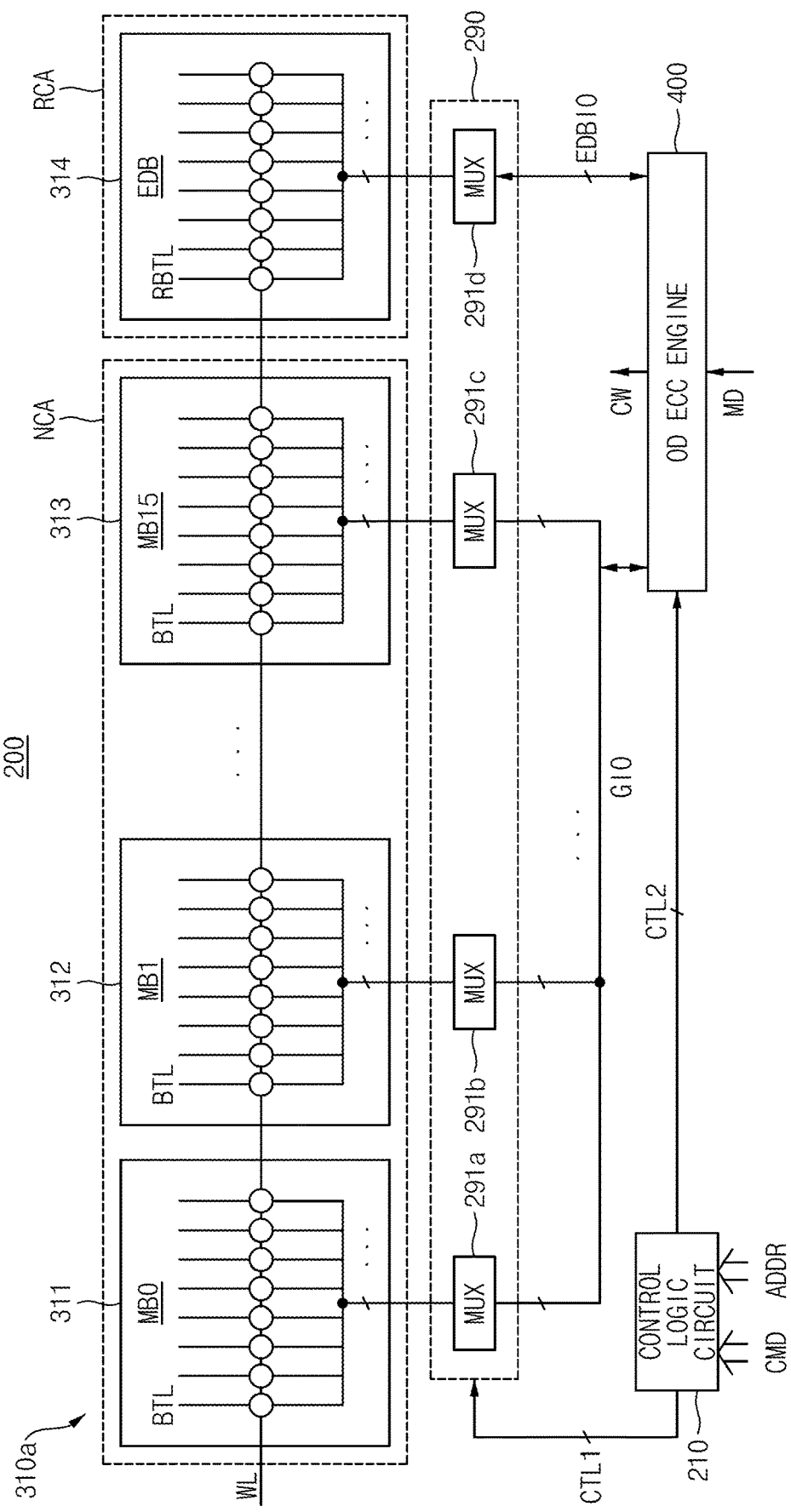
FIG. 19 illustrates a portion of the semiconductor memory device of FIG. 8 for explaining a write operation of a normal mode.

FIG. 19 illustrates a portion of the semiconductor memory device of FIG. 8 for explaining a write operation of a normal mode.

In FIG. 19, the control logic circuit 210, the first bank array 310a, the I/O gating circuit 290 and the on-die ECC engine 400 are illustrated.

Referring to FIG. 19, the first bank array 310a includes a normal cell region NCA and a redundancy cell region RCA.

The normal cell region NCA includes a plurality of first memory blocks MB0~MB15, i.e., 311~313, and the redundancy cell region RCA includes at least a second memory block 314. The first memory blocks 311~313 are memory blocks that determine or are used to determine a memory capacity of the semiconductor memory device 200. The second memory block 314 is for ECC and/or redundancy repair. Since the second memory block 314 for ECC and/or redundancy repair is used for ECC, data line repair and block repair to repair 'failed' cells generated in the first memory blocks 311~313, the second memory block 314 is also referred to as an EDB block. Each of the first memory blocks 311~313 includes memory cells coupled to a word-line WL and bit-lines BTL and the second memory block 314 includes memory cells coupled to word-line WL and redundancy bit-lines RBTL. The redundancy cell region RCA may be referred to as a parity cell region.

The I/O gating circuit 290 includes a plurality of switching circuits 291a~291d respectively connected to the first memory blocks 311~313 and the second memory block 314.

The on-die ECC engine 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the on-die ECC engine 400.

When the command CMD is a write command, the control logic circuit 210 provides the second control signal CTL2 to the on-die ECC engine 400. The on-die ECC engine 400 performs the ECC encoding on the main data MD to generate parity data associated with the main data MD and provides the I/O gating circuit 290 with the codeword CW including the main data MD and the parity data.

The control logic circuit 210 provides the first control signal CTL1 to the I/O gating circuit 290 such that the codeword CW is to be stored in a sub-page of the target page in the first bank array 310a.

Figure 20:
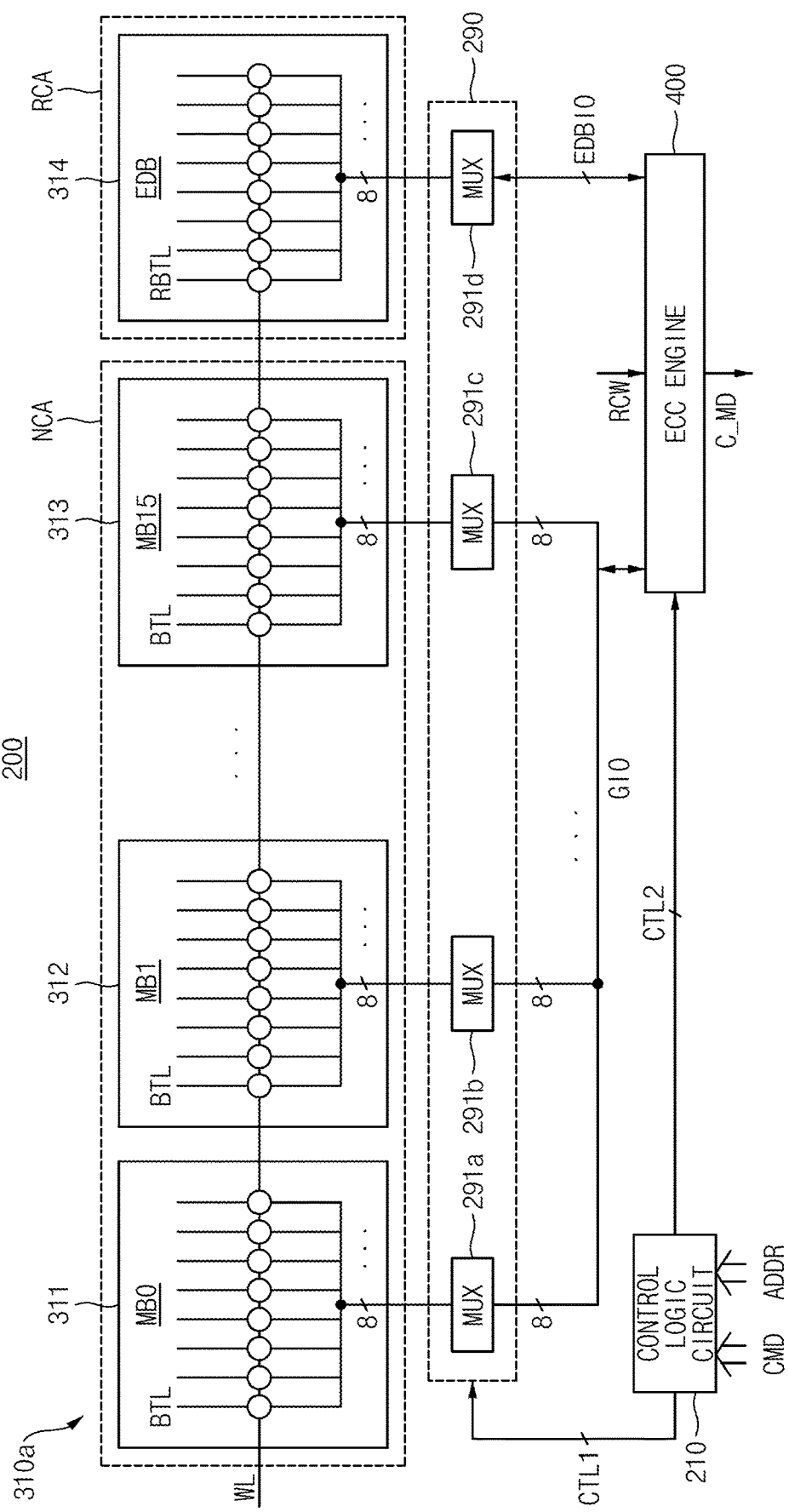
FIG. 20 illustrates a portion of the semiconductor memory device of FIG. 3 for explaining a read operation of the normal mode.

FIG. 20 illustrates a portion of the semiconductor memory device of FIG. 3 for explaining a read operation of the normal mode. Description repeated with FIG. 19 will be omitted.

Referring to FIG. 20, when the command CMD is a read command to designate a read operation, the control logic circuit 210 provides the first control signal CTL1 to the I/O gating circuit 290 such that a (read) codeword RCW stored in the sub-page of the target page in the first bank array 310a is provided to the on-die ECC engine 400.

The on-die ECC engine 400 performs an ECC decoding on the main data and the parity data in the codeword RCW, and corrects an error bit in the codeword RCW to output the corrected main data C_MD.

Figure 21:
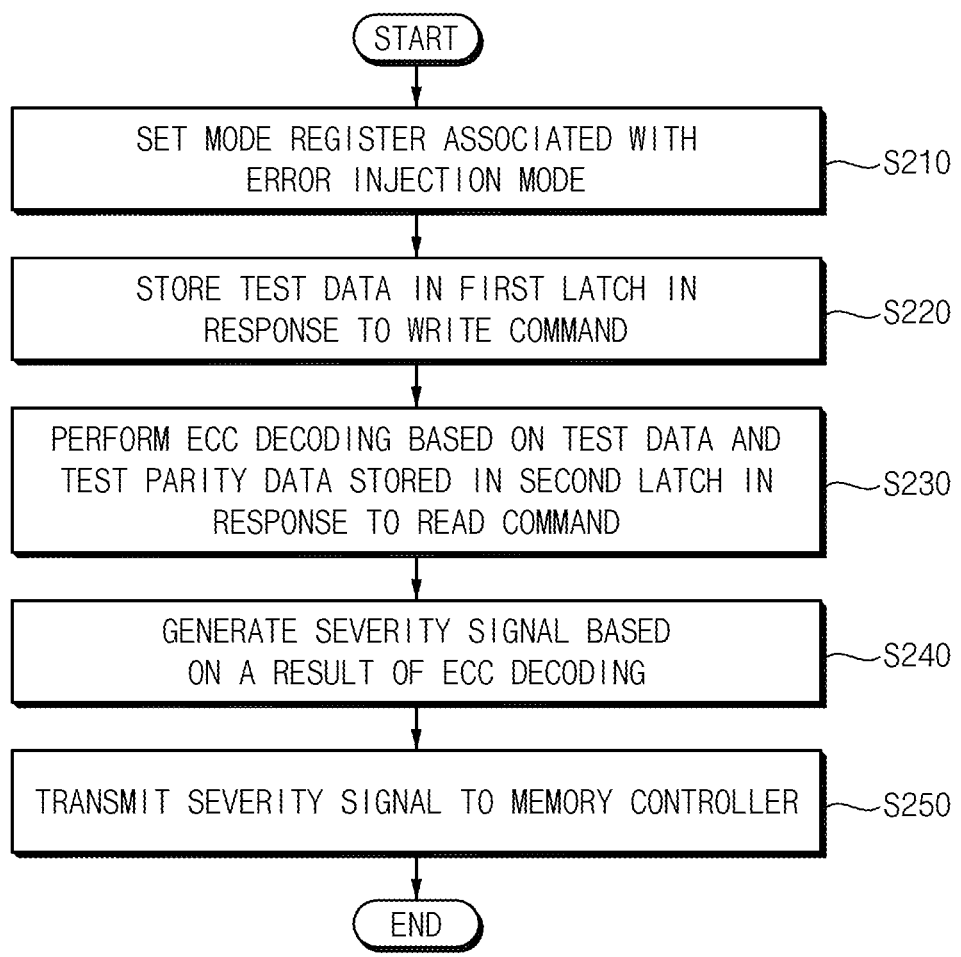
FIG. 21 is a flow chart illustrating a method of operating a semiconductor memory device according to example embodiments.

FIG. 21 is a flow chart illustrating a method of operating a semiconductor memory device according to example embodiments.

Referring to FIGS. 1 through 18 and 21, there is provided a method of operating a semiconductor memory device 200 that includes a memory cell array 310, an on-die ECC engine 400 and a control logic circuit 210.

According to the method, the (test) mode register MRx associated with an error injection mode in the control logic circuit 210 is set to a test mode in response to a first mode register set command from the memory controller (operation S210).

A plurality of operation codes OP[6:0] of the test mode register MRx may set whether to enter into an ECC error injection mode ECC Error Injection, may determine a type of a background data stored in the first latch 423, may determine whether a test parity data includes an error bit and may select a position of a parity bit including the error bit.

The on-die ECC engine 400 cuts off a connection with the memory cell array 310, the first latch 423 stores the test data TD in response to a write command from the memory controller 100 (operation S220) and the parity error pattern PEP is applied to the second latch 427.

The encoding/decoding logic 440 performs the ECC decoding on the test data TD stored in the first latch 423 and the test parity data TPRT stored in the second latch 427 in response to a read command from the memory controller 100 (operation S230) and the severity signal generator 480 generates a severity signal SEV based on a syndrome SDR corresponding to a result of the ECC decoding (operation S240).

The semiconductor memory device 200 transmits the severity signal SEV to the memory controller 100 (operation S250). The CPU 110 of the memory controller 100 determines whether the on-die ECC engine 400 operates normally based on the severity signal SEV.

Therefore, the semiconductor memory device according to example embodiments, in the test mode, cuts off a connection with the memory cell array, determines whether a test parity data includes an error bit and selects a position of a parity bit including the error bit by setting of the test mode register, injects at least one error bit in the test parity data and the test data, performs an ECC decoding based on the test data and the test parity data without receiving the test parity data from the memory controller and transmits a result of the ECC decoding to the memory controller. Accordingly, the semiconductor memory device may test the on-die ECC engine with respect to various error patterns without disclosing a parity check matrix and with cutting off a connection with the memory cell array, and thus enhance test coverage.

Figure 22:
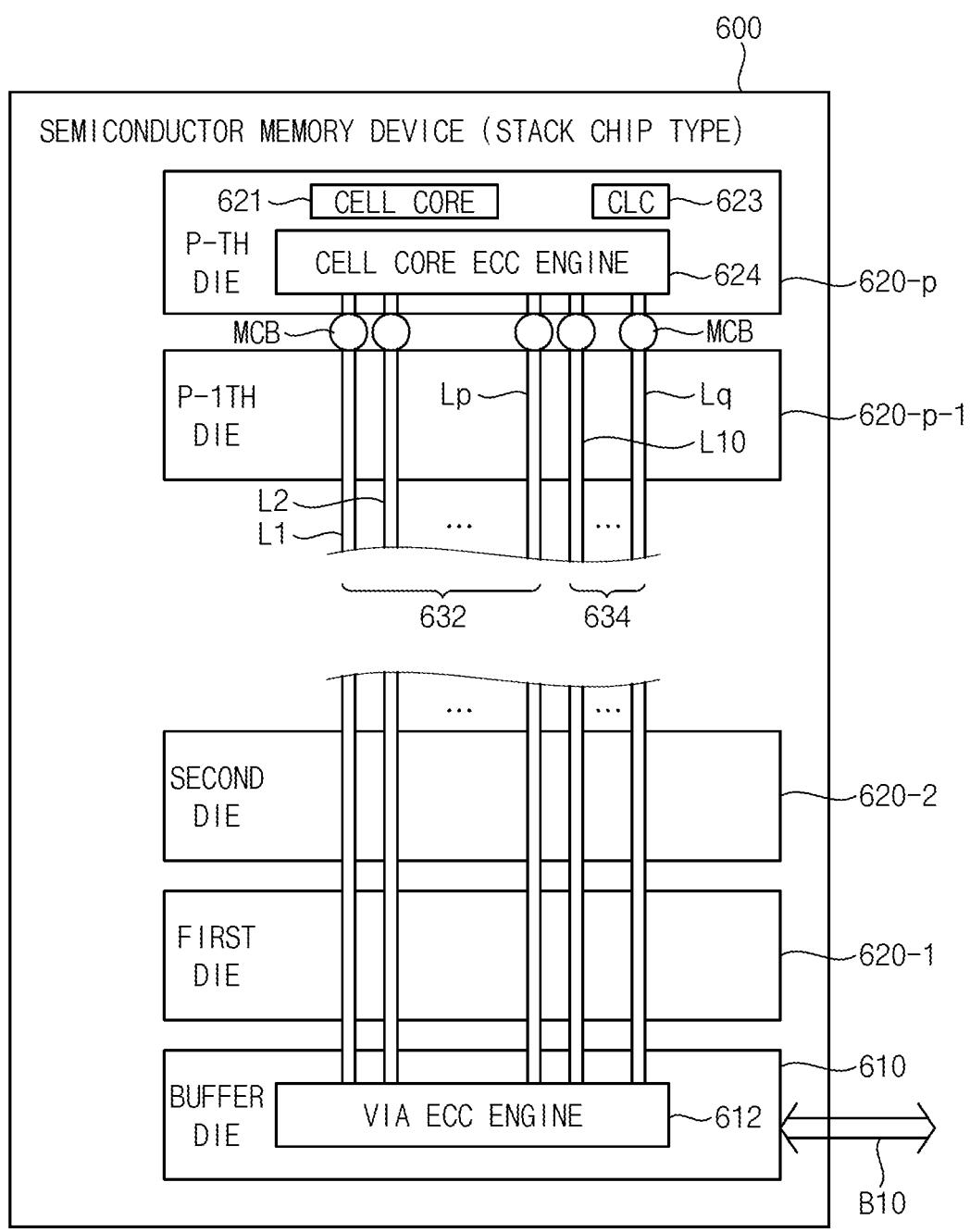
FIG. 22 is a block diagram illustrating a semiconductor memory device according to example embodiments.

FIG. 22 is a block diagram illustrating a semiconductor memory device according to example embodiments.

Referring to FIG. 22, a semiconductor memory device 600 may include at least one buffer die 610 and a plurality of memory dies 620-1 to 620-p providing a soft error analysis and a correcting function in a stacked chip structure. Here, p is an integer greater than three.

The plurality of memory dies 620-1 to 620*p* which is stacked on the at least one buffer die 610 and conveys data through a plurality of through silicon via (TSV) lines.

Each of the memory dies 620-1 to 620*p* may include a cell core 621 including a memory cell array, a cell core ECC engine 624 which generates transmission parity data (i.e., transmission parity data) based on transmission data to be sent to the at least one buffer die 610 and a control logic circuit CLC 623. The cell core ECC engine 624 may employ the on-die ECC engine 400 of FIG. 11. The control logic circuit 623 may include a test mode register and the test mode register may determine a type of a background data, may determine whether a test parity data includes an error bit and may select a position of a parity bit including the error bit through a plurality of operation codes.

The at least one buffer die 610 may include a via ECC engine 612 which corrects a transmission error using the transmission parity data when a transmission error is detected from the transmission data received through the TSV liens and generates error-corrected data.

The semiconductor memory device 600 may be a stack chip type memory device or a stacked memory device which conveys data and control signals through the TSV lines. The TSV lines may be also called 'through electrodes'.

A data TSV line group 632 which is formed at one memory die 620*p* may include TSV lines L1, L2 to Lp, and a parity TSV line group 634 may include TSV lines L10 to Lq.

The TSV lines L1, L2 to Lp of the data TSV line group 632 and the parity TSV lines L10 to Lq of the parity TSV line group 634 may be connected to micro bumps MCB which are correspondingly formed among the memory dies 620-1 to 620-*p*.

Each of the memory dies 620-1 to 620*p* may include DRAM cells each including at least one access transistor and one storage capacitor.

The semiconductor memory device 600 may have a three-dimensional (3D) chip structure or a 2.5D chip structure to communicate with the host through a data bus B10. The at least one buffer die 610 may be connected with the memory controller through the data bus B10.

The via ECC engine 612 may determine whether a transmission error occurs at the transmission data received through the data TSV line group 632, based on the transmission parity data received through the parity TSV line group 634. When a transmission error is detected, the via ECC engine 612 may correct the transmission error on the transmission data using the transmission parity data. When the transmission error is uncorrectable, the via ECC engine 612 may output information indicating occurrence of an uncorrectable data error.

Figure 23:
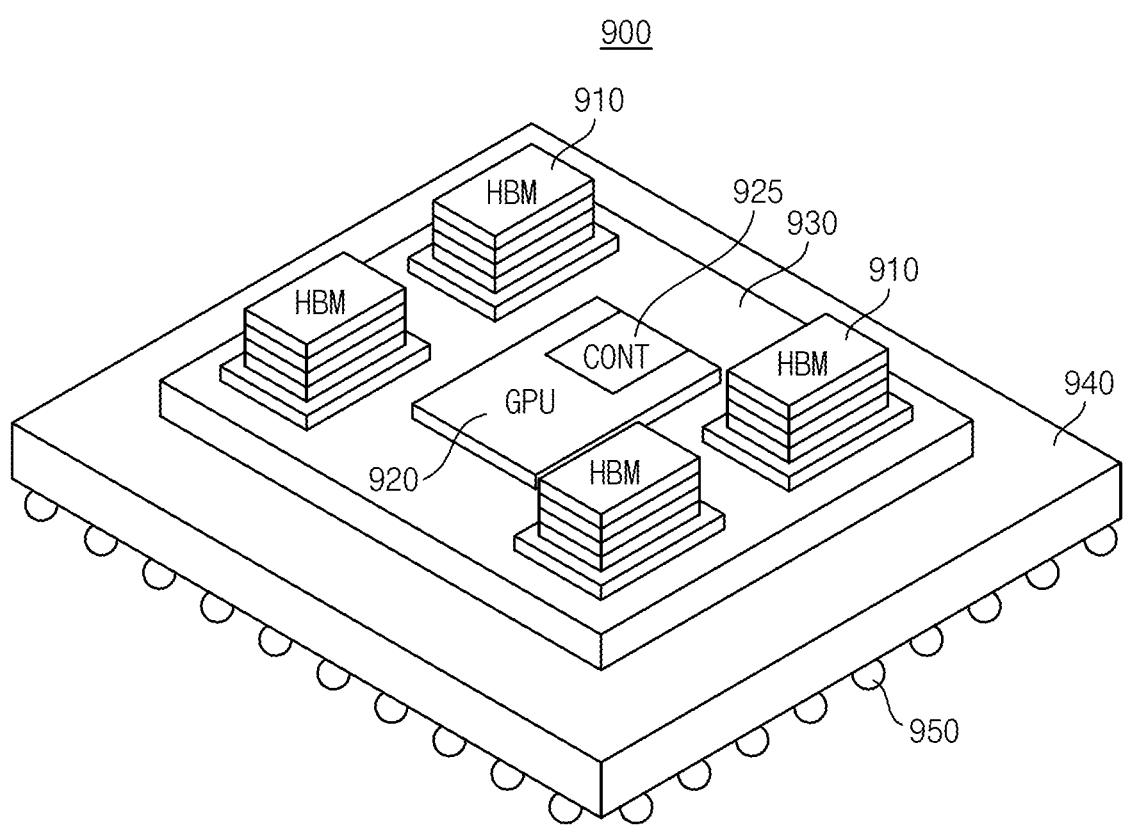
FIG. 23 is a diagram illustrating a semiconductor package including the stacked memory device, according to example embodiments.

FIG. 23 is a diagram illustrating a semiconductor package including the stacked memory device, according to example embodiments.

Referring to FIG. 23, a semiconductor package 900 may include one or more stacked memory devices 910 and a graphic processing unit (GPU) 920. The GPU 920 may include a memory controller 925.

The stacked memory devices 910 and the GPU 920 may be mounted on an interposer 930, and the interposer on which the stacked memory devices 910 and the GPU 920 are mounted may be mounted on a package substrate 940. The package substrate 940 may be mounted on solder balls 950. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include at least one buffer die and a plurality of memory dies. Each of the memory dies may include a memory cell array, an on-die ECC engine and a control logic circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to example embodiments, the semiconductor memory device, in the test mode, cuts off a connection with the memory cell array, determines whether a test parity data includes an error bit and selects a position of a parity bit including the error bit by setting of the test mode register, injects at least one error bit in the test parity data and the test data, performs an ECC decoding based on the test data and the test parity data without receiving the test parity data from the memory controller and transmits a result of the ECC decoding to the memory controller. Accordingly, the semiconductor memory device may test the on-die ECC engine with respect to various error patterns without disclosing a parity check matrix and with cutting off a connection with the memory cell array, and thus enhance test coverage.

Aspects of the present disclosure may be applied to systems using semiconductor memory devices that employ an on-die ECC engine and a plurality of volatile memory cells. For example, aspects of the present disclosure may be applied to systems such as a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
    a memory cell array including a plurality of memory cells coupled to a plurality of word-lines and a plurality of bit-lines;
    an on-die error correction code (ECC) engine including a first latch and a second latch; and
    a control logic circuit configured to control the on-die ECC engine,
    wherein the control logic circuit is configured to set the semiconductor memory device to a test mode in response to a first mode register set command from an external device, and
    wherein the on-die ECC engine, in the test mode, is configured to perform operations comprising:
        cutting off an electrical connection with the memory cell array;

receiving test data and a write command from the external device;

storing the test data in the first latch;

performing an ECC decoding on the test data stored in the first latch and a test parity data stored in the second latch in response to a read command from the external device; and providing the external device with a severity signal based on a result of the ECC decoding, wherein the severity signal indicates whether the test data and the test parity data include at least one error bit and indicates whether the at least one error bit is correctable, wherein the control logic circuit is configured to exit from the test mode in response to a second mode register set command from the external device applied after the read command, and wherein the second mode register set command is received after the severity signal is transmitted.

2. The semiconductor memory device of claim 1, wherein the first mode register set command corresponds to a test mode register set command.

3. The semiconductor memory device of claim 1, wherein the control logic circuit includes a test mode register configured to indicate the test mode;

wherein the test mode register is configured to store a plurality of operation codes;

wherein a first operation code of the plurality of operation codes indicates whether to enter into an ECC error injection mode;

wherein when the first operation code indicates entering into the ECC error injection mode,
  a second operation code of the plurality of operation codes indicates a type of a background data stored in the first latch, and
  a third operation code of the plurality of operation codes indicates whether the test parity data includes a parity error bit, and wherein when the third operation code indicates that the test parity data includes the parity error bit, fourth, fifth, sixth, and seventh operation codes of plurality of operation codes indicate a position of a parity bit including the parity error bit from among parity bits of the test parity data.

4. The semiconductor memory device of claim 3, wherein, in response to the second operation code indicating that the type of the background data is one of a first type or a second type, the on-die ECC engine is configured to perform operations comprising:

updating the test data including one error bit in the first latch;

performing the ECC decoding on the test data that includes the one error bit and the test parity data without the parity error bit; and providing the external device with the severity signal indicating that the at least one error bit is correctable, based on the result of the ECC decoding.

5. The semiconductor memory device of claim 3, wherein, in response to the second operation code indicating that the type of the background data is one of a first type or a second type, the on-die ECC engine is configured to perform operations comprising:

updating the test data without error bits in the first latch;

performing the ECC decoding on the test data without error bits and the test parity data including one error bit; and provide the external device with the severity signal indicating that the at least one error bit is correctable, based on the result of the ECC decoding.

6. The semiconductor memory device of claim 3, wherein, in response to the second operation code indicating that the type of the background data is one of a first type or a second type, the on-die ECC engine is configured to perform operations comprising:

updating the test data that includes one error bit in the first latch;

performing the ECC decoding on the test data that includes the one error bit and the test parity data including one parity error bit; and provide the external device with the severity signal indicating that the at least one error bit is uncorrectable, based on the result of the ECC decoding.

7. The semiconductor memory device of claim 3, wherein, in response to the second operation code indicating that the type of the background data is one of a first type or a second type, the on-die ECC engine is configured to perform operations comprising:

updating the test data that includes two or more error bits in the first latch;

performing the ECC decoding on the test data that includes the two or more error bits and the test parity data without parity error bits; and providing the external device with the severity signal indicating that the at least one error bit is uncorrectable, based on the ECC decoding.

8. The semiconductor memory device of claim 3, wherein a high level bit in the test data indicates an error bit, in response to the background data being a first type, and wherein a low level bit in the test data indicates an error bit, in response to the background data being a second type.

9. The semiconductor memory device of claim 1, wherein the on-die ECC engine includes:

a demultiplexer configured to provide the memory cell array with a main data from the external device in a normal mode and configured to provide the test data to the first latch in the test mode, in response to a first selection signal;

an encoding/decoding logic configured to perform operations comprising:
  generating a parity data by performing an ECC encoding on the main data in a write operation of the normal mode;
  generating a syndrome by performing an ECC decoding on the main data and the parity data in a read operation of the normal mode; and
  generating the syndrome by performing the ECC decoding on the test data and the test parity data in the test mode;

a data corrector configured to output a corrected data by correcting one error bit in the main data based on the syndrome in the normal mode and by correcting one error bit in the test data based on the syndrome in the test mode;

a buffer circuit configured to provide the memory cell array with the main data and the parity data in the normal mode and configured to cut the electrical connection with the memory cell array in the test mode;

a parity error pattern generator configured to apply a parity error pattern including an error bit to a background parity data stored in the second latch, based on an error bit selection signal; and a severity signal generator configured to generate the severity signal based on the syndrome.

10. The semiconductor memory device of claim 9, wherein the parity error pattern generator is configured to apply the parity error pattern including an error pattern in a position designated by the error bit selection signal, to the second latch; and
wherein the second latch is configured to generate the test parity data by performing an XOR operation on the background parity data and the parity error pattern.

11. The semiconductor memory device of claim 9, wherein the encoding/decoding logic includes:
a check bit generator electrically connected to the memory cell array that stores an ECC, the check bit generator configured to generate check bits based in the test data in the test mode; and
a syndrome generator configured to generate the syndrome based on whether each of the check bits is equal to a corresponding one of bits of the test parity data.

12. The semiconductor memory device of claim 9, wherein the data corrector is configured to perform operations comprising:
outputting the corrected data by correcting one error bit in response to the test data and the test parity data including the one error bit in the test mode; and
outputting the test data by refraining from correcting two or more error bits in response to the test data and the test parity data including the two or more error bits in the test mode.

13. The semiconductor memory device of claim 9, wherein the on-die ECC engine further includes:
a first register configured to provide a background data in the test mode;
a first multiplexer configured to output the main data provided from the memory cell array in the normal mode and configured to output the test data stored in the first latch in the test mode, in response to the first selection signal;
a second multiplexer configured to provide the main data to the encoding/decoding logic in the write operation of the normal mode and configured to provide an output of the first multiplexer to the encoding/decoding logic in the test mode, in response to a second selection signal;
a second register configured to provide the background parity data to the second latch in the test mode; and
a third multiplexer configured to provide the parity data from the memory cell array to the encoding/decoding logic in the normal mode and configured to provide the encoding/decoding logic with the test parity data stored in the second latch in the test mode, in response to the first selection signal.

14. The semiconductor memory device of claim 1, comprising:
at least one buffer die; and
a plurality of memory dies, the plurality of memory dies stacked on the at least one buffer die and configured to convey data through a plurality of through silicon via (TSV) lines,
wherein each of the plurality of memory dies includes the memory cell array, the control logic circuit and the on-die ECC engine.

15. A memory system comprising:
a semiconductor memory device; and
a memory controller configured to control the semiconductor memory device,
wherein the semiconductor memory device includes:
a memory cell array including a plurality of memory cells coupled to a plurality of word-lines and a plurality of bit-lines;
an on-die error correction code (ECC) engine including a first latch and a second latch; and
a control logic circuit configured to control the on-die ECC engine,
wherein the control logic circuit is configured to set the semiconductor memory device to a test mode in response to a first mode register set command from the memory controller, and
wherein the on-die ECC engine, in the test mode, is configured to perform operations comprising:
cutting an electrical connection with the memory cell array;
receiving test data and a write command from the memory controller;
storing the test data in the first latch;
performing an ECC decoding on the test data stored in the first latch and a test parity data stored in the second latch in response to a read command from the memory controller; and
providing the memory controller with a severity signal based on a result of the ECC decoding, wherein the severity signal indicates whether the test data and the test parity data include at least one error bit and indicates whether the at least one error bit is correctable,
wherein the control logic circuit includes a test mode register configured to set the test mode, and
wherein the memory controller comprises a central processing unit (CPU) configured to perform operations comprising:
setting the test mode register such that at least one of the test data and the test parity data includes the error bit; and
determining whether the on-die ECC engine operates normally based on a comparison of the severity signal and an expected severity signal.

16. The memory system of claim 15, wherein the memory controller is included in a graphic processing unit.

17. The memory system of claim 16, wherein the control logic circuit includes a test mode register configured to set the test mode;
wherein the test mode register is configured to store a plurality of operation codes;
wherein a first operation code of the plurality of operation codes indicates whether to enter into an ECC error injection mode;
wherein when the first operation code indicates to enter into the ECC error injection mode, a second operation code of the plurality of operation codes indicates a type of a background data stored in the first latch;
wherein a third operation code of the plurality of operation codes indicates whether the test parity data includes an error bit; and
wherein when the third operation code indicates that the test parity data includes the error bit, fourth, fifth, sixth, and seventh operation codes of the plurality of operation codes indicate a position of a parity bit including the error bit from among parity bits of the test parity data.

18. A semiconductor memory device comprising:
a memory cell array including a plurality of memory cells coupled to a plurality of word-lines and a plurality of bit-lines;

an on-die error correction code (ECC) engine including a first latch and a second latch; and a control logic circuit configured to control the on-die ECC engine, wherein the control logic circuit is configured to set the semiconductor memory device to a test mode in response to a first mode register set command from an external device, and wherein the on-die ECC engine, in the test mode, is configured to perform operations comprising:

cutting an electrical connection with the memory cell array;

receiving test data and a write command from the external device;

storing the test data in the first latch;

performing an ECC decoding on the test data stored in the first latch and a test parity data stored in the second latch in response to a read command from the external device; and providing the external device with a severity signal based on a result of the ECC decoding, wherein the severity signal indicates whether the test data and the test parity data include at least one error bit and indicates whether the at least one error bit is correctable, and wherein the on-die ECC engine includes:

an encoding/decoding logic configured to generate a syndrome by performing the ECC decoding on the test data stored in the first latch and the test parity data stored in the second latch in the test mode;

a data corrector configured to output a corrected test data by correcting a selected error bit in the test data in the test mode;

a parity error pattern generator configured to apply a parity error pattern including an error bit to a background parity data stored in the second latch, based on an error bit selection signal; and a severity signal generator configured to generate the severity signal based on the syndrome, wherein the control logic circuit is configured to exit from the test mode in response to a second mode register set command from the external device applied after the read command, and wherein the second mode register set command is received after the severity signal is transmitted.

* * * * *